United States Patent
Dames et al.

(10) Patent No.: US 11,860,198 B2
(45) Date of Patent: Jan. 2, 2024

(54) MUTUAL INDUCTANCE-TYPE CURRENT SENSING

(71) Applicant: SENTEC LTD, Cambridge (GB)

(72) Inventors: Andrew Dames, Cambridge (GB); Mark England, Milton (GB); Joseph Adam, Impington (GB)

(73) Assignee: SENTEC LTD, Cambridge (GB)

( * ) Notice: Subject to any disclaimer, the term of this patent is extended or adjusted under 35 U.S.C. 154(b) by 399 days.

(21) Appl. No.: 17/295,111

(22) PCT Filed: Nov. 19, 2019

(86) PCT No.: PCT/GB2019/053280
§ 371 (c)(1),
(2) Date: May 19, 2021

(87) PCT Pub. No.: WO2020/104794
PCT Pub. Date: May 28, 2020

(65) Prior Publication Data
US 2022/0018878 A1    Jan. 20, 2022

(30) Foreign Application Priority Data
Nov. 19, 2018  (GB) ..................................... 1818835

(51) Int. Cl.
*H03M 1/10* (2006.01)
*G01R 15/18* (2006.01)
*G01R 19/252* (2006.01)

(52) U.S. Cl.
CPC ......... *G01R 15/181* (2013.01); *G01R 19/252* (2013.01)

(58) Field of Classification Search
CPC ........................... G01R 15/181; H03M 1/1245
(Continued)

(56) References Cited

U.S. PATENT DOCUMENTS

2016/0157017 A1* 6/2016 Lesso .................... G01P 15/125
381/71.7
2017/0356939 A1* 12/2017 Hurwitz ................. G01R 21/06

FOREIGN PATENT DOCUMENTS

DE       102018202089 A1    10/2018

OTHER PUBLICATIONS

International Search Report and Written Opinion from related international application PCT/GB2019/053280, dated Feb. 27, 2020, all pages cited in its entirety.
(Continued)

*Primary Examiner* — Peguy Jean Pierre
(74) *Attorney, Agent, or Firm* — Burr & Forman LLP

(57) ABSTRACT

Mutual inductance-type current sensing apparatus (1) is described which includes a mutual inductance current sensor (11) having a first transfer function. The apparatus (1) also includes a low-pass filter (12) which receives a signal from the current sensor (11). The low-pass filter (12) has a second transfer function configured to attenuate one or more harmonic components of the signal. The apparatus (1) also includes an analogue-to-digital converter (13) which receives and digitises a filtered signal output from the low-pass filter. The apparatus (1) also includes a controller (8) configured to process a digitised signal from the analogue-to-digital converter (13) using a digital processing chain configured to compensate for the frequency and phase responses of the first transfer function and the second transfer function.

20 Claims, 9 Drawing Sheets

(58) Field of Classification Search
USPC .......................................... 341/155, 120, 118
See application file for complete search history.

(56) References Cited

OTHER PUBLICATIONS

Analog Devices: "ADE7753 Energy Metering IC, Evaluation Board Documentation", Internet Citation, Feb. 28, 2002. (URL:http://smd.hu/Data/Analog/ADE77xx/Evalboards/ADE7753Eval_prB.pdf) pp. 1, 9 and figures 1,2.
"Active and Apparent Energy Metering IC With DI/DT Sensor Interface", Preliminary Technical Data Analog Devices, Analog Devices, Norwood, MA, US, No. ADE7753, Jan. 1, 2002, pp. 1-37, XP001503342, pp. 1, 2.
Barber John P: "The Use of Rogowski Coils in Current Measurement", 2014 17th International Symposium on Electromagnetic Launch Technology, IEEE, Jul. 7, 2014, pp. 1-4, XP032657418, DOI: 10.1109/EML.2014.6920689; Sections I, II, III; Figure 5.
Ibrahim Mohamed E et al: "Power Frequency AC Voltage Measurement Based on Double Wound Rogowski Coil", High Voltage, the Institution of Engineering and Technology, Michael Faraday House, Six Hills Way, Stevenage Herts. SG1 2AY, UK, vol. 2, No. 2, Jun. 1, 2017, pp. 129-135, XP006076267, ISSN: 2397-7264, DOI: 10.1049/HVE.20160091 figure 1.

* cited by examiner

MUTUAL INDUCTANCE-TYPE CURRENT SENSING

FIELD

The present invention relates to mutual inductance-type current sensing particularly, but not exclusively in electrical power measurement.

BACKGROUND

Products for electric power measurement typically use voltage dividers and current sensors to feed low voltage signals into analogue to digital converters (ADCs) and form a measure of the instantaneous power by multiplying these current and voltage signals together. In electricity metering applications, this power signal is integrated over time into energy, which is typically used as the basis for billing. The performance requirements for such systems are defined by standards such as American National Standards Institute (ANSI) ANSI C12, International Electrotechnical Committee (IEC) IEC62053 or European Standard EN50470 and typically include power accuracy over a wide dynamic range of currents (for example, 0.2% of power over a range of about 1000:1) and power accuracy when the phases of the fundamental current and voltage waveforms do not match (for example 0.3% of power over a range of 60°). This leads to corresponding demanding requirements on the performance of the current measurement system, requiring high accuracy of magnitude and phase performance over a very wide dynamic range.

In many applications (for example ANSI form 2 or form 12 meters, or 2-wire IEC meters which measure both conductors to detect tampering), several currents at different potentials have to be measured, and hence electrical isolation between the current sensors (and to the ADCs) is required, normally where currents at different potentials need to be measured. Mutual inductance sensors, for example Rogowski coil sensors, have become increasingly popular because they provide electrical isolation, and because of their inherent linearity over a wide dynamic range of currents. There are many types and styles of sensors, typically comprising one or more air-cored coils with a mutual inductance to a primary current carrying inductor. These can be fixed coil sensors such as the PA3202NL available from Pulse Electronics®, flexible Rogowski coils such as the MFC150 available from Algodue® or U.S. Pat. No. 9,494,620 B1, or planar coils such as described in U.S. Pat. No. 6,414,475 B1, 6,734,661 B1 or 8,378,662 B1 (which are incorporated herein by reference), or any other type or geometry of mutual inductance sensor which has a response which is broadly proportional to the rate of change of current. For sinusoidal A.C. currents, such as might be ideally found in A.C. power systems, the mutual inductance coil sensor output is also a sinusoid, phase shifted by 90 degrees relative to the current. The frequency response of a mutual inductance sensor coil increases at 20 dB/decade, often up to very high frequency relative to the typical fundamental A.C. signal of interest.

There are two common solutions used to recover the true current waveform from the mutual inductance coil output. The first of these is to use an analogue integrator. An example implementation of an integrator would be constructed using an operational amplifier, using a combination of a feedback capacitor, C, and a series input resistor, R. An ideal integrator has a gain versus frequency response which decreases by 20 dB/decade, cancelling the 20 dB/decade increase associated with the sensor. This means that it has an infinite D.C. gain, so practical implementations of analogue integrators also incorporate high pass filtering, preferably second order so that the gain approaching D.C. is zero.

There are two significant disadvantages with analogue integrators.

First, the gain depends directly on the feedback capacitor, and hence the initial accuracy, temperature stability and long-term stability of the system gain depend one-to-one on the tolerance, temperature coefficient and stability of the part chosen. It can be hard to find capacitors with the correct value that meet this stability requirement.

Secondly, the high-pass filter frequency should be significantly lower than the fundamental A.C. line frequency (for example, 10 Hz) to avoid impacting the phase response at line frequency and altering the gain as the line frequency is varied. Because the corner frequency is low, the required capacitor values tend to be large, and the parts are large and expensive.

The second approach to recover the true current waveform is to integrate the signal digitally. In this case, the mutual inductance sensor signal is first sampled using an ADC, typically with anti-alias low-pass filtering to attenuate any signals at or above the Nyquist frequency which would otherwise alias. Digital filters then provide the functions of the high pass filter and integrator noted in the analogue signal processing description above. Because these filters are defined using digital coefficients, there are no issues with tolerance, temperature stability or long-term drift, and there are no component compromises in implementing filters with characteristics and orders which best match the application requirements. With sinusoidal currents, in systems where the current signal is required in a digitised form, the digital integrator architecture generally performs better than the analogue architecture.

In traditional power distribution systems, the majority of loads are either induction motors or resistive heaters, drawing currents which are predominantly sinusoidal. Although there are some non-sinusoidal loads, such as inductively ballasted fluorescent lamps, the harmonic content is relatively benign. Modern power distribution systems are increasingly supplying loads which draw significantly non-sinusoidal currents. For example, in the power supply of an electronic appliance, the initial stage may comprise a rectifier and D.C. capacitor. In such a system, current is only drawn intermittently when the line voltage exceeds the D.C. capacitor voltage, resulting in a discontinuous current waveform. Similarly, phase-fired triacs used to control filament lighting draw a current waveform with sharp transitions when the triac is turned on part way through the voltage cycle.

Currents drawn by such loads can contain large levels of harmonics, with the amplitude of the harmonics exceeding the amplitude of the fundamental in some cases. As noted above, the frequency response of a mutual inductance sensor increases at 20 dB/decade, so the signals associated with these harmonics can be very large. With a conventional analogue integrator, this is generally not significant, as the integrator is typically the first stage in the signal processing chain, which means there is no risk of the signal clipping. Using the digital approach, however, there is a significant risk that high-current harmonic-rich current sources can cause the mutual inductance sensor output signal to clip at the ADC inputs. To counteract this, the ADC typically needs to have a much larger input signal range than would be required to measure the maximum fundamental current. This can lead to compromises in the overall dynamic range of the current-measuring system, for example because of the ADC noise floor, non-linearity or quantisation noise, especially when considering that the typical dynamic range of currents to be measured is already well in excess of 1000:1.

Traditional metering standards placed little requirement on the ability to measure high-order harmonics, so it was acceptable to curtail the frequency response of the mutual inductance sensor or signal processing. Modern standards recognise that the harmonic contents have increased significantly, and it is not unusual to see requirements specifying accurate performance up to the $50^{th}$ harmonic.

The present invention seeks to provide a signal processing arrangement which combines the stability of performance of a digital integrator with the dynamic range performance of an analogue integrator.

SUMMARY

According to a first aspect of the invention there is provided apparatus including a mutual inductance current sensor having a first transfer function. The apparatus also includes a low-pass filter which receives a signal from the current sensor. The low-pass filter has a second transfer function configured to attenuate one or more harmonic components of the signal. The apparatus also includes an analogue-to-digital converter which receives and digitises a filtered signal output from the low-pass filter. The apparatus also includes a controller configured to process a digitised current signal from the analogue-to-digital converter using a digital processing chain configured to compensate for the frequency and phase responses of the first transfer function and the second transfer function.

The digital processing chain may include a first digital filter stage having a third transfer function configured to compensate for the frequency and phase response of the first transfer function.

The digital processing chain may include a second digital filter stage having a fourth transfer function configured to compensate for the frequency and phase response of the second transfer function.

The analogue-to-digital converter may be integrated as part of the controller. The signal path of the apparatus prior to the analogue-to-digital convertor may include further components in addition to the current sensor and the low-pass filter, for example, one or more additional filtering and/or signal conditioning circuits.

The low-pass filter may take the form of a first order filter. The low-pass filter may take the form of a second or higher order filter. The low-pass filter may take the form of a cascaded filter. The low-pass filter may take the form of any analogue components disposed on a signal path between the mutual inductance current sensor and the analogue-to-digital converter and having an overall second transfer function which has the effect of attenuating one or more harmonic components in the signal.

The digital processing chain may include two or more digital filter stages. The digital processing chain may include further digital filter stages in addition to the first and second digital filter stages. The digital processing chain may take the form of a cascade of digital filter stages. The digital processing chain may include one or more filtering and/or signal conditioning stages. Filtering and/or signal conditioning stages of the digital processing chain may be arranged either before or after the first and/or second digital filter stages.

The controller may also be configured to calculate, based on the output of the digital processing chain, one or more parameters of an alternating current measured by the current sensor. One of more parameters of the alternating current may include a root mean square current, the amplitudes and phases of the current harmonics, and when combined with a voltage waveform in a power or electricity meter or a power analyser, the active, reactive and apparent powers, either total, fundamental-only or per-harmonic, and so forth.

The third transfer function may be an inverse of the first transfer function across at least part of a bandwidth of the analogue-to-digital converter. The third transfer function may correspond to a numerical integration. The fourth transfer function may be an inverse of the second transfer function across at least part of a bandwidth of the analogue-to-digital converter. Compensating for the frequency and phase response of the second transfer function may correspond to reducing or removing changes in phase and/or amplitude introduced by the low-pass filter.

The apparatus may be for measuring a signal corresponding to an alternating current having a fundamental frequency. The apparatus may be configured to measure up to a predetermined harmonic of the fundamental frequency. The second transfer function of the low-pass filter may have a −3 dB corner frequency which lies between the fundamental frequency and the predetermined harmonic.

The −3 dB corner frequency of the second transfer function may be at least two times, at least three times, at least four times, at least five times, at least eight times, at least ten times, at least sixteen times or at least 20 times the fundamental frequency.

The −3 dB frequency response of the second transfer function may be less than 90%, less than 80%, less than 50%, less than 20%, or less than 10% of the predetermined harmonic. The −3 dB frequency response of the second transfer function may be less than 90%, less than 80%, less than 50%, less than 20%, or less than 10% of a predetermined maximum desired measurement frequency. In a 50 Hz or 60 Hz power system, the −3 dB frequency response of the second transfer function may be less than 100 Hz, less than 150 Hz, less than 200 Hz, less than 300 Hz, less than 400 Hz, less than 500 Hz, less than 600 Hz, less than 800 Hz, or less than 1000 Hz.

The digital processing chain may include an infinite impulse response, IIR, filter. The digital processing chain may include two or more IIR filters.

The digital processing chain may include a finite impulse response, FIR, filter. The digital processing chain may include two or more FIR filters. The digital processing chain may include two or more filters including at least one IIR filter and at least one FIR filter.

The low-pass filter may include at least one series resistance and at least one parallel capacitance.

The second transfer function may be substantially similar or identical to a single RC filter response. A series resistance may be located directly on a signal path from the mutual inductance current sensor to the analogue-to-digital converter. A parallel capacitance may connect between a ground or reference potential and a signal path from the mutual inductance current sensor to the analogue-to-digital converter.

The digital processing chain may be calibrated following fabrication of the apparatus in order to compensate for the specific low-pass filter.

The digital processing chain of each individual apparatus may be calibrated once that individual apparatus has been fabricated/assembled, so that the calibration may take account of tolerances of the parameters of the components forming/providing the low-pass filter.

Processing the digitised signal using the digital processing chain may include processing the digitised signal using one or more difference equations. The coefficients of at least one of the difference equations may be configured to compensate for the frequency and phase response of the second transfer function. The digital processing chain may include two or more difference equations.

The controller may also be configured to numerically integrate the input or output of a difference equation which compensates for the frequency and phase response of the second transfer function. A difference equation of the one or more difference equations may be configured to integrate the digitised signal and compensate for the frequency and phase response of the first transfer function at the same time as compensating for the frequency and phase response of the second transfer function.

The digital processing chain may include a second digital filter stage having a fourth transfer function configured to compensate for the frequency and phase response of the second transfer function, and processing the digitised signal using the digital processing chain may include transforming the digitised signal from the time domain to the frequency domain. Processing the digitised signal using the digital processing chain may include applying the fourth transfer function in the frequency domain.

The output of applying the fourth transfer function may be a filtered frequency domain signal.

The controller may also be configured to transform the filtered frequency domain signal from the frequency domain back to the time domain. The controller may also be configured to calculate one or more parameters of an alternating current corresponding to the signal based on the filtered frequency domain signal.

The controller may also be configured to numerically integrate the input or output of the second digital filter stage in either the time domain or the frequency domain.

Signals may be transformed from time to frequency domains using Fourier transform methods, for example, discrete Fourier transform methods such as a fast Fourier transform (FFT) method. Signals may be transformed from frequency to time domains using inverse Fourier transform methods. Signals may be transformed between time and frequency domains using Laplace transform methods.

Processing the digitised signal using the digital processing chain may include numerically integrating the digitised signal to generate an integrated output signal. Processing the digitised signal using the digital processing chain may include adding a fraction of the digitised signal to the integrated output signal.

The fraction of the digitised signal added to the integrated output signal may be calibrated for the specific low-pass filter of an individual apparatus, in order to compensate for the frequency and phase response of corresponding second transfer function.

Numerical integration of the digitised signal may be based on the most recently sampled value of the digitised signal, any number of previously sampled values of the digitised signal and/or any previously calculated values of the integrated output signal. Numerical integration may be implemented as a stage of the digital processing change.

The low-pass filter may be a second order filter or higher.

A dynamic range of measurements obtained using the apparatus may be improved compared to a second apparatus which is identical to the apparatus except that the second apparatus does not include the low-pass filter. Equivalently, the dynamic range required by the analogue-to-digital convertor of the apparatus may be improved compared to a second apparatus which is identical to the apparatus except that the second apparatus does not include the low-pass filter.

An electricity meter may include the apparatus. An electricity meter may include two or more of the apparatus. Each of one or more mutual inductance current sensors of the electricity meter may be inductively coupled to a corresponding conductor which supplies power from one of more supplies to one or more loads.

The electricity meter may be used to measure energy or power supplied to each load. The electricity meter may also include a conductor for transferring energy from a supply to each load.

The electricity meter may meet with non-sinusoidal accuracy requirements of the American National Standards Institute (ANSI), for example ANSI C12.20:2015.

A dynamic range of current measurements obtained using the electricity meter may be improved compared to a second electricity meter which is identical to the electricity meter except that the second electricity meter does not include the low-pass filter.

The dynamic range of current measurements obtained using the electricity meter may be greater than or equal to two times, four times, six times, eight times, or ten times larger than a dynamic range of current measurements obtained using the second electricity meter.

According to a second aspect of the invention, there is provided apparatus for processing signals received from a mutual inductance current sensor having a first transfer function. The apparatus includes a low-pass filter which receives a signal from the current sensor. The low-pass filter has a second transfer function configured to attenuate one or more harmonic components of the signal. The apparatus also includes an analogue-to-digital converter which receives and digitises a filtered signal output from the low-pass filter. The apparatus also includes a controller configured to process a digitised signal from the analogue-to-digital converter using a digital processing chain configured to compensate for the frequency and phase responses of the first transfer function and the second transfer function.

The apparatus for processing signals received from a mutual inductance current sensor may include features corresponding to any features of the apparatus and/or electricity meter according to the first aspect.

According to a third aspect of the invention, there is provided a method including receiving a signal from a mutual inductance current sensor having a first transfer function. The method also includes filtering the received signal in the analogue domain using a low-pass filter having a second transfer function configured to attenuate one or more harmonic components from the signal. The method also includes converting the filtered signal to the digital domain to generate a digitised signal. The method also includes processing the digitised current signal using a digital processing chain configured to compensate for the frequency and phase responses of the first transfer function and the second transfer function.

The method may also include features corresponding to any features of the apparatus and/or electricity meter according to the first aspect.

The signal may correspond to an alternating current have a fundamental frequency. The method may be intended to measure up to a predetermined harmonic of the fundamental frequency. The second transfer function of the low-pass filter may have a −3 dB corner frequency which lies between the fundamental frequency and the predetermined harmonic.

Processing the digitised signal using the digital processing chain may include processing the digitised signal using one or more difference equations. The coefficients of at least one of the difference equations may be configured to compensate for the frequency and phase response of the second transfer function.

The digital processing chain may include a second digital filter stage having a fourth transfer function configured to compensate for the frequency and phase response of the second transfer function, and processing the digitised signal using the digital processing chain may include transforming the digitised signal from the time domain to the frequency domain. Processing the digitised signal using the digital processing chain may include applying the fourth transfer function in the frequency domain.

Processing the digitised signal using the digital processing chain may include numerically integrating the digitised signal to generate an integrated output signal. Processing the digitised signal using the digital processing chain may include adding a fraction of the digitised signal to the integrated output signal.

According to a fourth aspect of the present invention there is provided an architecture of analogue signal conditioning and digital signal processing for use with a mutual inductance sensor which may have to accurately measure high levels of harmonic current over a wide dynamic range of currents. The frequency response of the analogue input connected to the sensor is low-pass filtered with a −3 dB corner frequency significantly below the Nyquist frequency (i.e. half the effective digitisation frequency) of the subsequent ADC and significantly below the highest harmonic required to be measured by the application. For example, in a power measurement application, the −3 dB corner frequency might be five- to ten-times the fundamental frequency, whereas the highest harmonic of interest might be 50 times the fundamental, and the current waveform might contain significant even higher harmonics (for example the digitisation frequency might be 128 times the fundamental). The filter limits the maximum amplitude that the ADC has to measure as a result of harmonics, by limiting the bandwidth. The subsequent digital signal processing includes a compensation stage which counteracts the frequency and phase response of the low-pass filter to effectively reconstruct the signal attenuated by the low-pass filter such that the effective frequency and phase response of the current sensor system extends well above the −3 dB corner frequency, to include the harmonics required for the application.

According to a fifth aspect of the present invention there is provided a signal conditioning system for a mutual inductance current sensor forming part of a power or energy measurement system characterised in that the analogue signal chain between the current sensor and a subsequent analogue to digital converter contains one or more low-pass filters which have a combined −3 dB frequency response which is materially lower than the highest frequency required to be measured by the application.

The low-pass filter may comprise at least one series R followed by one parallel C element between the current sensor and the subsequent analogue to digital converter. The low-pass filter response may be substantially similar to a single RC filter response. The current sensor data from the analogue to digital converter may undergo subsequent digital signal processing which includes at least a digital integrator.

The amplitude and phase error caused by the analogue low-pass filter may be compensated by an inverse filter in a subsequent digital signal processing system fed from the analogue to digital converter, where one or more coefficients of the inverse filter are adjusted to match the phase error between the processed current and voltage signals. The inverse filter may be an infinite impulse response (IIR) filter or a finite impulse response (FIR) filter.

The amplitude and phase error caused by the analogue low-pass filtering (e.g. using a single pole analogue low-pass filter) may be compensated in the digital signal processing by adding in a proportion of a signal derived from data before the digital integrator on to the signal after the digital integrator, where the proportion of signal added is adjusted to match the phase error between the processed current and voltage signals. The digital integrator may be implemented as an IIR filter.

The signal processing may include a Fourier transform to the frequency domain, and in which the compensation of the amplitude and phase response of the low-pass filter or filters is achieved by the frequency domain filtering of the data. The digital integrator may be implemented as a filter in the frequency domain.

According to a sixth aspect of the present invention there is provided signal conditioning system for a mutual inductance current sensor connected to an analogue to digital converter characterised in that the analogue signal chain between the current sensor and a subsequent analogue to digital converter contains one or more low-pass filters which have a combined −3 dB frequency response which is materially lower than the highest frequency required to be measured by the application, and the digital signal processing at least partially compensates for the attenuation and phase response of the analogue low-pass filtering.

The dynamic range of the current measurement in the application may be materially larger than an equivalent system in which the low-pass filter is omitted.

The system may form part of an electricity meter. The electricity meter preferably meets with non-sinusoidal accuracy requirements of ANSI C12.20:2015 or later.

According to a seventh aspect of the present invention there is provided a signal conditioning system for a mutual inductance current sensor which includes at least one low-pass filter.

At least one low-pass filter may be placed between the current sensor and any device which may be capable of converting analogue signals to digital values. The −3 dB frequency response may be lower than highest frequency required to be measured by the current sensor. The −3 dB frequency response may be less than 90%, less than 80%, less than 50%, less than 20% or less than 10% of the highest frequency required to be measured by the current sensor. The −3 dB frequency response may be less than 100 Hz, less than 150 Hz, less than 200 Hz, less than 300 Hz, less than 400 Hz, less than 500 Hz, less than 600 Hz, less than 800 Hz or less than 1,000 Hz.

The system may form part of a power or energy measurement system. The system may contain one or more low-pass filters, which have a combined −3 dB frequency response which is materially lower than the highest frequency required to be measured by the application. The low-pass filter(s) may comprise at least one series R followed by one parallel C element between the current sensor and the subsequent analogue to digital converter. The low-pass filter response may be substantially similar to a single RC filter response. The current sensor data from the analogue to digital converter may undergo subsequent digital signal processing which includes at least a digital integrator.

The amplitude and phase error caused by the analogue low-pass filter may be compensated by an inverse filter in a subsequent digital signal processing system fed from the analogue to digital converter, where one or more coefficients of the inverse filter are adjusted to match the phase error between the processed current and voltage signals. The inverse filter may be an infinite impulse response (IIR) filter or a finite impulse response (FIR) filter.

The amplitude and phase error caused by the analogue low-pass filtering (e.g. using a single-pole analogue low-pass filter) may be compensated in the digital signal processing by adding in a proportion of a signal derived from data before the digital integrator on to the signal after the digital integrator, where the proportion of signal added is adjusted to match the phase error between the processed current and voltage signals. The digital integrator may be implemented as an IIR filter.

The signal processing may include a Fourier transform to the frequency domain, and in which the compensation of the amplitude and phase response of the low-pass filter or filters is achieved by the frequency domain filtering of the data. The digital integrator may be implemented as a filter in the frequency domain.

According to an eighth aspect of the present invention there is provided a signal conditioning system for a mutual inductance current sensor connected to an analogue to digital converter characterised in that the analogue signal chain between the current sensor and a subsequent analogue to digital converter contains one or more low-pass filters which have a combined −3 dB frequency response which is materially lower than the highest frequency required to be measured by the application, and the digital signal processing at least partially compensates for the attenuation and phase response of the analogue low-pass filtering.

The dynamic range of the current measurement in the application is materially (for example, more than 2 times, more than 4 times, more than 6 times, more than 8 times, or more than 10 times) larger than an equivalent system in which the low-pass filter is omitted.

The system may form part of an electricity meter. The electricity meter may meet with non-sinusoidal accuracy requirements of ANSI C12.20:2015 or later.

The amplitude and/or phase changes associated with the low-pass filter(s) may be allowed for and/or compensated for in the digital domain.

The disclosure herein relates to the field of A.C. current sensing using mutual inductance or Rogowski Coil type sensors, which have outputs (e.g. voltage outputs) proportional to the rate of change of current, particularly but not exclusively when used in electrical power measurement applications. The disclosure describes an architecture in which the dynamic range of such a current sensor measuring wide bandwidth signals and connected using an analogue signal conditioning circuit to an analogue to digital converter is extended by deliberately reducing the amplitude of higher frequency signals of interest using analogue low-pass filtering, and at least partially correcting for the characteristics of the low-pass filtering by signal processing in the digital domain. The disclosure further includes a method to allow for component value tolerances in the low-pass filtering by adjusting coefficients in the digital domain to match the phase response against a reference channel such as a voltage signal.

BRIEF DESCRIPTION OF THE DRAWINGS

Certain embodiments of the present invention will now be described, by way of example, with reference to the accompanying drawings, in which.

DETAILED DESCRIPTION OF CERTAIN EMBODIMENTS

Figure 1:
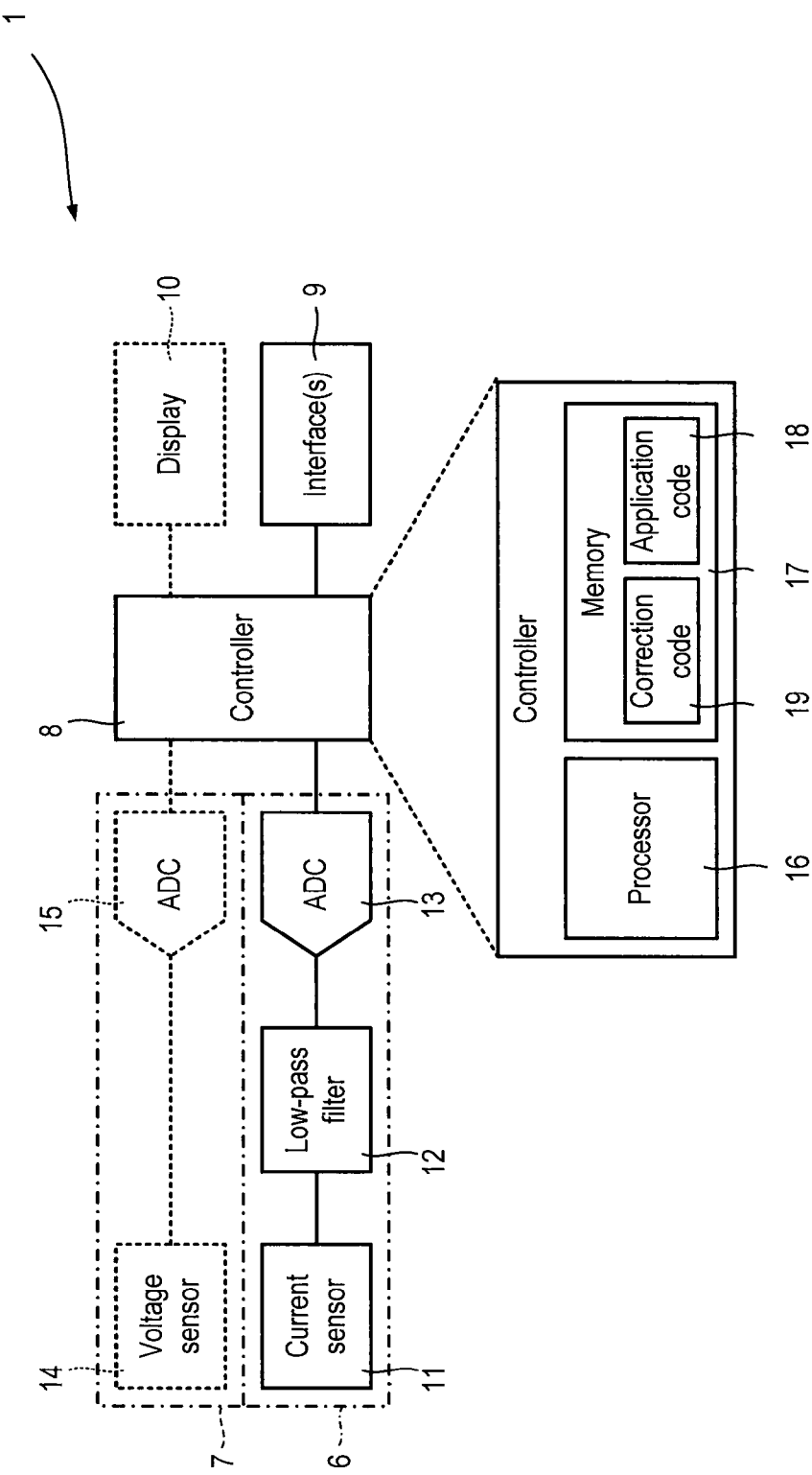
FIG. 1 is a schematic block diagram of a power measurement system which includes a mutual inductance current sensor.

The present specification is concerned with A.C. current sensing using mutual inductance current sensors. Mutual inductance current sensors have voltage outputs proportional to the rate of change of current, particularly but not exclusively when used in electrical power measurement applications. One example of a mutual inductance current sensor is a Rogowski Coil type sensor. However, the methods of the present specification are not limited by the type of mutual inductance sensor used, and are applicable to any current sensors having an output proportional to the rate of change of a monitored current.

As discussed in the background section, in traditional power distribution systems, currents which are drawn may be predominantly sinusoidal. However, modern power distribution systems are increasingly supplying loads which draw significantly non-sinusoidal currents.

Currents drawn by such loads may contain harmonic components with significant amplitudes, in some cases exceeding even the amplitude of the fundamental (or base) frequency of the power supply. As noted in the background section, the frequency response of a mutual inductance current sensor increases at 20 dB/decade, so that signals associated with these harmonic components can be very large in a signal from the mutual inductance current sensor.

For measurements employing digital integration (or other digital processing methods), the signal from the mutual inductance current sensor must be digitised. In such systems, harmonic components having amplitudes exceeding or significantly exceeding the fundamental frequency of a current may present a problem for providing adequate performance of an analogue-to-digital converter (ADC).

An N-bit ADC digitises an analogue signal into $2^N-1$ signal levels (or binary words). For an N-bit ADC having minimum $V_{min}$ and maximum $V_{max}$ input voltages, the input range is $\Delta V = V_{max} - V_{min}$, the quantisation step is approximately $\delta V = \Delta V/(2^N - 1)$ and the dynamic range is $\sim \Delta V/\delta V$. The input range $\Delta V$ should be large enough to accommodate the peak-to-peak amplitude of the harmonic components without signal clipping. However, when the fundamental frequency and/or lower harmonic components have significantly lower amplitude than the higher harmonics, the quantisation step $\delta V$ may have a poor dynamic range for measuring the fundamental frequency and/or lower harmonic components. For example, if the fundamental frequency has amplitude $\sim V_0$ in the signal from the current sensor, the dynamic range for the fundamental frequency is $\sim V_0/\delta V$. Extending this, for the $n^{th}$ harmonic having amplitude $V_n$ (n an integer $\geq 2$), the measurement has a dynamic range of $\sim V_n/\delta V$. Ideally, a measurement system should have adequate dynamic range across the fundamental frequency and all harmonics of interest. This may be achieved by simply increasing the number N of bits for the ADC. However, this will require the use of high performance ADCs, which are more complex and expensive. Furthermore, even with a high performance ADC, the lower amplitude signal components will still experience reduced dynamic range for digitisation.

The present specification addresses this problem by using low-pass filtering in the analogue domain to attenuate the higher harmonics. The low-pass filtering has a second transfer function (a first transfer function corresponds to the frequency and phase response of the mutual inductance current sensor itself). In systems where the higher harmonics have greater amplitude than a fundamental frequency and/or lower harmonic components, this permits the input range $\Delta V$ to be set lower, improving dynamic range across all signal components of the low-pass filtered signal. Following digitisation by the ADC, the digitised signal is processed using a digital processing chain including one or more digital filters. A first digital filter stage has a third transfer function configured to compensate for the frequency and phase responses of the current sensor. In other words, the first digital filter stage is configured to invert (as much as is practicable) the first transfer function. The first digital filter stage may correspond to a filter in the form of a numerical integration. The first digital filter stage is a typical feature for processing signals from a mutual inductance current sensor.

The present invention concerns the combination of the analogue domain low-pass filter having the second transfer function with a digital processing chain including a second digital filter stage having a third transfer function configured to compensate for the frequency and phase responses of the low-pass filter. In other words, the second digital filter stage is configured to invert (as much as is practicable) the second transfer function.

The digital processing chain may include one or more further filter stages configured to compensate for frequency and phase effects of any other circuitry present in the analogue domain signal path in addition to the current sensor and low-pass filter. The amplitude of the reconstructed harmonic components should be within a few %, and at least within 10%, of the amplitude of the same components in the originally measured current (before the effects of measurement by the mutual inductance current sensor and attenuation by the low-pass filtering.

In some examples, the order of the first and second digital filter stages may be reversed. In other examples, the transfer functions of the first and second digital filter stages may be multiplied together and the product applied as a single stage.

Power Management System

Referring to FIG. 1, an apparatus 1 including a mutual inductance current sensor 11 is shown.

Figure 2:
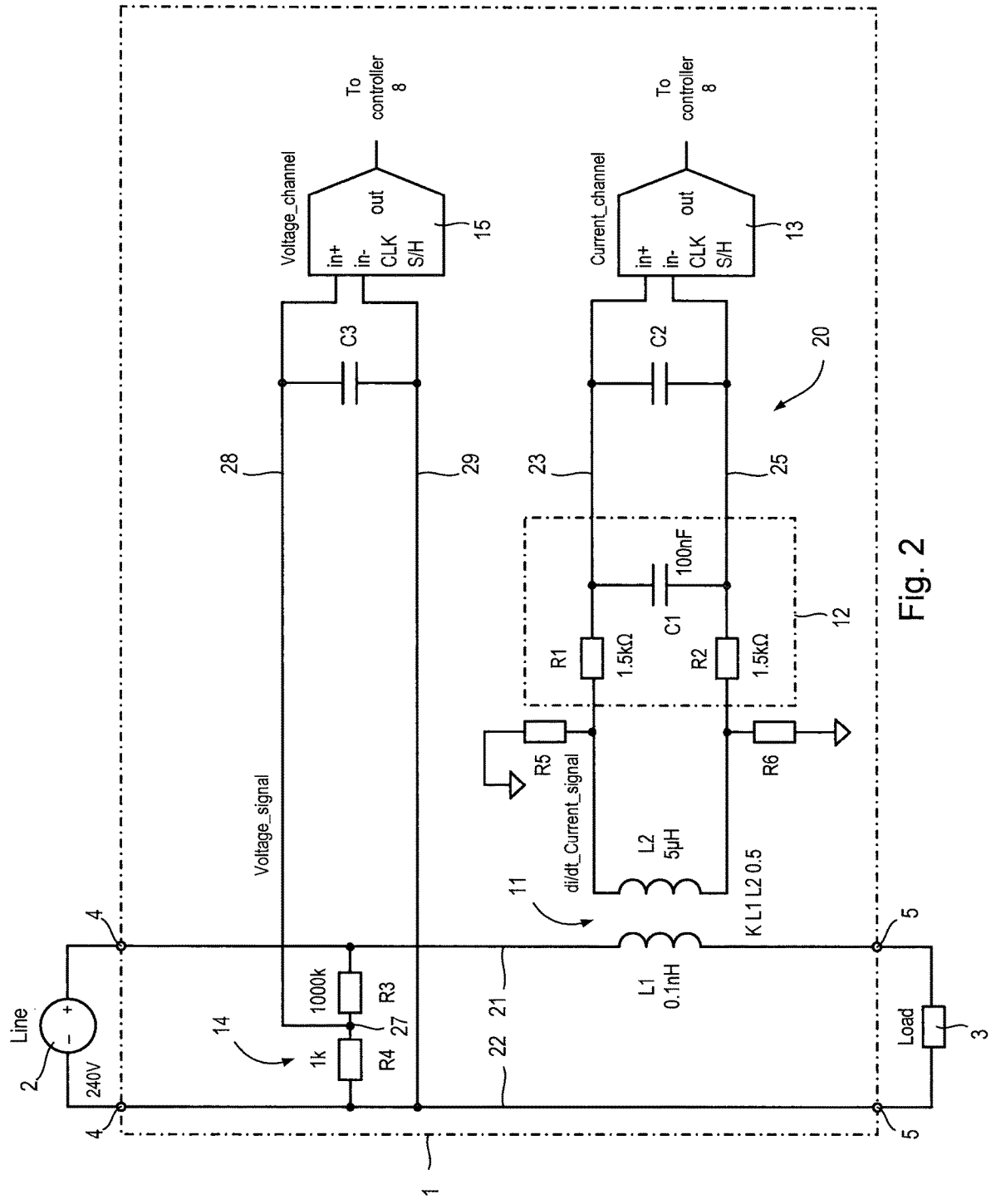
FIG. 2 is a schematic circuit diagram of a part of a power measurement system based on a mutual inductance sensor.

The apparatus 1 may take the form of an electricity meter or other device for monitoring and/or measuring an alternating current (A.C.) electrical system. The current sensor 11 may be connected between a power line 2 (FIG. 2) and a load 3 (FIG. 2) via respective sets of terminals 4, 5 (FIG. 2). The apparatus 1 can measure current only, or current and voltage.

The apparatus 1 includes a current sensing section 6, an optional voltage sensing section 7, a controller 8 in the form of a microcontroller, a wired and/or wireless network interface(s) 9 for connecting the apparatus 1 to external device(s) (not shown), such as meter reader, and/or remote devices(s) or system(s) (not shown), such as a computer server (not shown), for example, via the Internet, and an optional display 10.

The current sensing section 6 includes a mutual inductance current sensor 11, such as a Rogowski coil or other suitable coil arrangement for measuring current using mutual inductance. The mutual inductance current sensor 11 corresponds to a first transfer function $G_{sens}$. As will be explained in more detail hereinafter, the current sensing section 6 includes a low-pass filter 12 interposed between the current sensor 11 and an analogue-to-digital converter (ADC) 13. The low-pass filter 12 corresponds to a second transfer function $G_{filt}$.

The voltage sensing section 7 includes a voltage sensor 14 and an ADC 15.

The controller 8 includes at least one processor 16 and memory 17. Application code 18 and code 19 for correcting for the current sensor 11 and low-pass filter 12 ("correction code") are stored in non-volatile memory (not shown) and loaded into memory 17 for execution by the at least one processor 16.

The current sensor 11 measures a signal S(t). The signal S(t) is actually related (by first transfer function $G_{sens}$) to the time derivative of an actual current I(t) though an inductively coupled conductor 21 (FIG. 2), $$\text{i.e. } S(t) \propto \frac{d}{dt}(I(t)).$$

The low-pass filter 12 receives the signal S(t) from the current sensor 11. The low-pass filter 12 has a frequency response (or second transfer function) $G_{filt}$ which is configured to attenuate one or more harmonic components of the signal S(t) received from the current sensor 11. The combination of the first transfer function $G_{sens}$ of the current sensor 11 and the second transfer function $G_{filt}$ of the low-pass filter 12 may be viewed as having an overall analogue domain transfer function G, which describes the changes (as a function of frequency) in amplitude and phase of a filtered signal $S_{filt}(t)$ output from the low-pass filter 12, when compared to the original current I(t).

The analogue-to-digital converter 13 receives and digitises the filtered signal $S_{filt}(t)$ output from the low-pass filter 12. The controller 8 is configured to process a digitised signal $S_{ADC}$ from the analogue-to-digital converter using a digital processing chain having an overall digital domain transfer function H (the digital processing chain may also be referred to as H herein). The digital processing chain H may typically be a multi-stage filter which includes a first digital filter stage which has a third transfer function $H_{sens}$ configured to at least partially invert the first transfer function (e.g. a stage which implements an integrator to recover a current signal from the dI/dt signal $S_{ADC}$). The digital processing chain H also includes a second digital filter stage having a fourth transfer function $H_{filt}$, which is configured to at least partially invert the frequency response of the low-pass filter 12. The first digital filter stage may also be referred to as $H_{sens}$ herein and the second digital filter section may also be referred to as $H_{filt}$ herein.

The correction code 19 implements the digital processing chain H (including first and second digital filter stages $H_{sens}$, $H_{filt}$) when executed by the processor 16. The overall digital domain transfer function H is configured to compensate for the frequency and phase response of the overall analogue domain transfer function G. In other words, the overall digital domain transfer function H is configured to reconstruct the actual current I(t) as accurately as possible.

The digitised signal $S_{ADC}$ processed using the first and second digital filter stages $H_{sens}$, $H_{filt}$ may correspond to the direct output of the ADC 13. However, the digital processing chain H may also include further stages, for example one or more additional filtering and/or signal conditioning stages (not shown), which may be arrange before, after and/or between the first and second digital filter stages $H_{sens}$, $H_{filt}$.

The low-pass filter 12 may take the form of a first order filter, a second order filter, or a higher order filter. In some examples the low-pass filter 12 may take the form of a cascaded filter. The low-pass filter 12 may take the form of any analogue components disposed on a signal path between the mutual inductance current sensor 11 and the ADC 13, and having an overall second transfer function $G_{filt}$ which has the effect of attenuating one or more harmonic components in the signal S(t) received from the current sensor 11.

In some examples, the low-pass filter 12 may include at least one series resistance R and at least one parallel capacitance C. In particularly simple examples, the low-pass filter 12 may take the form of a simple, single stage RC filter. Herein, a series resistance R is located directly on a signal path from the mutual inductance current sensor 11 to the ADC 13. A parallel capacitance connects between a ground or reference potential and the signal path from the mutual inductance current sensor 11 to the ADC 13.

As mentioned hereinbefore, the digital processing chain H includes first and second digital filter stages $H_{sens}$, $H_{filt}$, and may also include one or more further filters (or stages), for example in the form of a cascaded filter. The digital processing chain H may include one or more infinite impulse response, IIR, filters and/or one or more finite impulse response, FIR, filters to provide the individual digital filter stages.

The controller 8 may also be configured to calculate one or more parameters of the actual current I(t) based on the output of the digital processing chain H. One or more parameters of the actual current I(t) may include a root mean square current, the amplitudes and phases of the current harmonics, and when combined with a voltage waveform in a power or electricity meter or a power analyser, the active, reactive and apparent powers, either total, fundamental-only or per-harmonic, and so forth.

The overall digital domain transfer function H may be an inverse of the overall analogue domain transfer function G across at least part of a bandwidth of the ADC 13. To this end, the third transfer function $H_{sens}$ may be substantially inverse to the first transfer function $G_{sens}$ across at least part of a bandwidth of the ADC 13, and the fourth transfer function $H_{filt}$ may be substantially inverse to the second transfer function $G_{filt}$ across at least part of a bandwidth of the ADC 13. Compensating for the frequency and phase response of the first and second transfer functions $G_{sens}$, $G_{filt}$ may correspond to reducing or removing changes in phase and/or amplitude introduced by the current sensor 11 and low-pass filter 12. In general, for an individual apparatus 1, the digital processing chain (overall digital domain transfer function) H stored by the correction code 19 of that apparatuses 1 controller 8 should be calibrated specifically to the current sensor 11 and low-pass filter 12 of that apparatus 1 (and their corresponding first and second transfer functions $G_{sens}$, $G_{filt}$, or equivalently the overall analogue domain transfer function G). The variability is expected to be dominated by the low-pass filter 12 (and corresponding second transfer function $G_{filt}$), in particular the precise values of passive components such as resistors and capacitors. In other words, once each apparatus 1 has been assembled/fabricated, the first transfer function $G_{sens}$ corresponding to the current sensor 11 and the second transfer function $G_{filt}$ corresponding to the low-pass filter 12 (plus any transfer function(s) corresponding to other components in the analogue signal path) are measured, and the measurements are used to fine-tune the overall digital domain transfer function H (fine-tuning may be dominated by, or consist entirely of, adjustments to the fourth transfer function $H_{filt}$). In this way, the apparatus 1 may take account of tolerances/variations of the parameters of components used to provide the apparatus 1, and in particular the low-pass filter 12.

In some examples, the fourth transfer function $H_{filt}$ may be calibrated independently of the current sensor 11, for example, the second transfer function $G_{filt}$ may be measured without making measurements of the current sensor 11 transfer function $G_{sens}$, or even before the current sensor 11 is added to the apparatus 1. In some examples, the third transfer function $H_{sens}$ may not require calibration and only the fourth transfer function $H_{filt}$ may be calibrated.

The apparatus 1 may be intended for measuring a signal S(t) corresponding to a current I(t) having a fundamental frequency $f_0$ (sometimes also referred to as the "first" harmonic) and wherein the apparatus is configured to measure up to a predetermined harmonic of the fundamental frequency $f_0$. For example, the apparatus may be intended to measure up to a $K^{th}$ harmonic having frequency $Kf_0$, with K an integer ≥2 (though in practice it is likely that harmonics up to at least K=10 would be desired, if not higher e.g. K=50. The second transfer function $G_{filt}$ corresponding to the low-pass filter has a −3 dB corner frequency which lies between the fundamental frequency $f_0$ and the predetermined harmonic $Kf_0$. In some examples, the −3 dB corner frequency of the second transfer function $G_{filt}$ may be as little as five times the fundamental frequency $f_0$.

In general, the −3 dB corner frequency of the second transfer function $G_{filt}$ may be configured in dependence on the specific application. For example, the −3 dB frequency response of the second transfer function $G_{filt}$ may be less than 90%, less than 80%, less than 50%, less than 20%, or less than 10% of the predetermined harmonic $Kf_0$. For specific applications relating to metering and/or monitoring of A.C. power distribution systems, the −3 dB frequency response of the second transfer function $G_{filt}$ may be less than 100 Hz, less than 150 Hz, less than 200 Hz, less than 300 Hz, less than 400 Hz, less than 500 Hz, less than 600 Hz, less than 800 Hz, or less than 1000 Hz, depending on the fundamental frequency $f_0$ of the A.C. power distribution system and the desired accuracy.

In some examples, one or more apparatuses 1 may be built into, or connected to, an electrical meter (not shown). Each mutual inductance current sensor 11 is inductively coupled to a conductor, for example a first line 21 (FIG. 2), which supplies power from a supply line 2 (FIG. 2) to a load 3 (FIG. 2). An electricity meter (not shown) may be used to measure energy or power supplied to the load 3 (FIG. 2). The conductor(s), for example the first line 21 (FIG. 2), may be part of the electrical meter (not shown) or separate from the electrical meter (not shown). The electrical meter (not shown) may satisfy non-sinusoidal accuracy requirements of one or more standard including, for example, American National Standards Institute, ANSI, C12.20:2015.

Using the apparatus 1, a dynamic range of measurements obtained using the apparatus 1 may be improved compared to a second electricity meter which is identical to the electricity meter except that the second electricity meter does not include the low-pass filter. For example, a dynamic range of current measurements obtained using the apparatus 1 may be greater than or equal to two times, four times, six times, eight times, or ten times larger than a dynamic range of current measurements obtained using an apparatus (not shown) which is identical to the apparatus 1 except that the low-pass filter is omitted. The comparison of dynamic ranges may refer to the signal component having minimum dynamic range in the apparatus (not shown) which is identical to the apparatus 1 except that the low-pass filter is omitted, also assuming that the input range ΔV of the ADC is increased to avoid any clipping of higher frequency harmonics.

Although shown as a separate component to the controller 8, the ADC 13 may instead be integrated as part of the controller 8. In other words, the controller 8 may be a controller which includes one or more ADC input ports (not shown), and one of these ADC input ports (not shown) may provide the ADC 13. Similarly, in some examples the low-pass filter 12 may be integrated as a single unit with the current sensor 11.

Referring to FIG. 2, an example of an analogue front end 20 of the apparatus 1 and the ADCs 13, 15 is shown.

The current sensor 11 includes a coil L2 inductively coupled to a first line 21 between a first input terminal 4 and a first load terminal 5. The coil L2 is connected to the low-pass filter 12 which includes first and second resistors R1, R2 and a capacitor C1.

The first resistor R1 is arranged in series in a first dI/dt signal path 23 between a first end of the coil L2 and a first input in+ of the first ADC 13. The second resistor R2 is arranged in series in a second dI/dt signal path 25 between a second end of the coil L2 and a second input in− of the first ADC 13. The capacitor C1 is arranged in parallel with the coil L2 between the first and second dI/dt current paths 23, 25.

The voltage sensor 14 includes a voltage divider between the first and second line-load paths 21, 22 having a tap 27 connected via a first voltage signal path 28 to a first input in+ of the second ADC 15. The second line-load path 22 is connected via a second voltage signal path 29 to the second input in− of the second ADC 15.

Limiting the Analogue Bandwidth and Dynamic Range

For the purposes of understanding the benefits of the invention, it is useful to consider a waveform with a sharp current step, such as might be seen when a triac (not shown) supplying a resistive load (not shown) is turned on.

Figure 3:
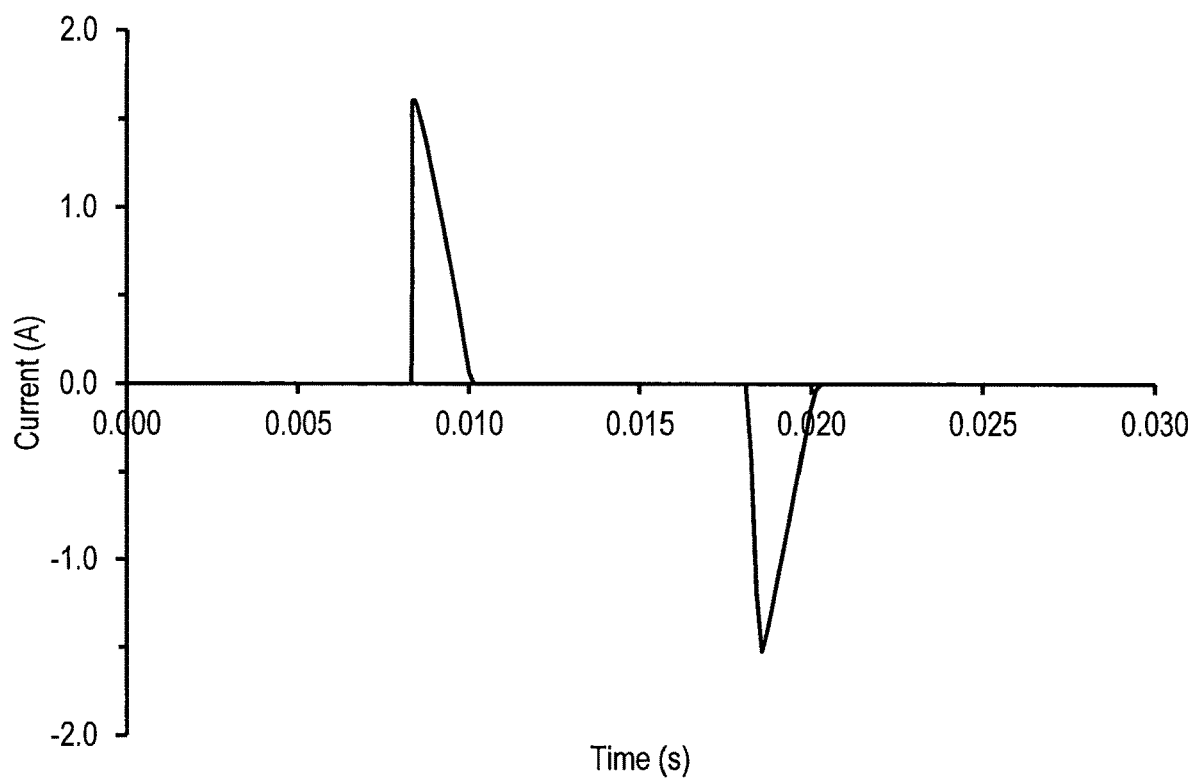
FIG. 3 is a current waveform for a 100-ohm resistive load switched with a triac at 135° phase angle.

Referring to FIG. 3, an example of a waveform with a sharp current step is shown which is in the form of a waveform for a 100-ohm load switched with a triac at 135° on a 50 Hz supply. The waveform shown in FIG. 3 is only one example of an A.C. current I(t) which may be measured using the apparatus 1. A mutual inductance sensor (not shown) measuring the resulting current step current will produce a voltage whose peak amplitude is proportional to the bandwidth of the apparatus 1 prior to analog-to-digital conversion, including the low-pass filter and any other filtering or signal conditioning components (not shown) prior to the ADC 13 of the current sensing section 6.

Figure 4:
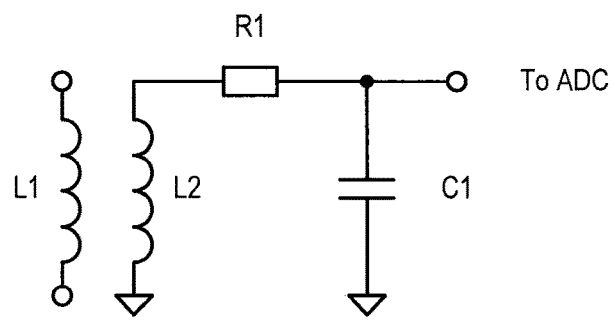
FIG. 4 is a simplified schematic circuit of an RC filter which can be used to limit bandwidth prior to the signal shown in FIG. 1 being supplied to an ADC.

Referring also to FIG. 4, to limit the bandwidth, a simple passive RC network acting as a low-pass filter 12 can be placed before an analogue-to-digital converter 13 reducing the response bandwidth down to typically between 100 Hz and 1,000 Hz. In this type of power application, full amplitude current steps are typically limited by supply reactance, usually to no more than 2 kHz, so these bandwidth limits give reductions in the required dynamic range of an ADC of between 2 and 20 times.

Phase Shift

When considering performance of such a bandwidth-limited mutual inductance sensor in a power measurement application, a key parameter of concern is the phase shift at the fundamental line frequency, which is typically 50 or 60 Hz. Just 0.1° of phase shift can produce 0.3% error in power measurement at a power factor of 0.5, which is a typical measurement point in an energy metering standard. The 60 Hz phase lag from a simple RC low-pass filter at 600 Hz is about 6°, and if the RC value is in error by 1%, the phase will change by 0.06°, which will cause a change of ~0.2% in the power calculated at a power factor of 0.5. As the RC filter −3 dB corner frequency is lowered, this effect becomes proportionately larger.

Another way of stating this is that if the bandwidth is ten times the line frequency, a 1% shift in bandwidth will give a 1 mrad (milli-radian) shift in line frequency phase and if it is five times the line frequency, then it will be 2 mrad.

Digital Correction

An RC low-pass filter at, for example, five- to ten-times the fundamental frequency $f_0$, if applied to a current sensor in a power metering application, would by itself lead to an unacceptably poor system response, both in terms of frequency and phase response (resulting from the corresponding overall analogue domain transfer function G). One way to compensate for a small phase mismatch between current and voltage channels in a power measurement system is simply to delay one signal relative to the other. Whilst it is technically feasible to apply a delay to correct for 6° of phase lag in the example hereinbefore described (namely by 28 μs), this does not correct for the frequency dependence of the amplitude response, either when the fundamental frequency varies, or to accurately measure the effects of harmonic current. In the example given, there would be 3 dB attenuation at a $10^{th}$ harmonic, which would be unacceptable.

A solution to this is to create a second digital filter stage $H_{filt}$ which includes the inverse amplitude and phase characteristics of the RC filter, so that both the phase and amplitude effects from the low-pass filter 12 are exactly or substantially reversed. In an ideal case, the fourth transfer function $H_{filt}$ would be the inverse of the second transfer function $G_{filt}$. Exact reversal/inversion of the second transfer function $G_{filt}$ will be difficult in practice, so that substantially reversed refers to reversed (inverted) as much as is practical. For example, substantially reversed may corresponds to the phase and amplitude effects of the RC filter being reduced so that at the harmonics of interest, i.e. up to a predetermined $K^{th}$ harmonic, the amplitude of the $k^{th}$ harmonic component ($2 \leq k \leq K$) in the digitally filtered signal is within a few percent (10%, 5%, 2%) of the $k^{th}$ harmonic component prior to low-pass filtering. This processing by the controller 8 will mean that the phase is correct at the fundamental frequency $f_0$, changes in fundamental frequency $f_0$ do not cause amplitude errors, and harmonic amplitudes are correct.

The second digital filter stage (having fourth transfer function) $H_{filt}$ may be implemented as an Infinite Impulse Response (IIR) filter, derived from the inverse response of the low-pass filter 12, for example an RC filter, effectively a zero compensating for the pole of the RC filter (filters may often defined in terms of a number of zeroes and a number of poles). For stability near the Nyquist frequency, a higher frequency pole may also be needed, so a 3-tap IIR can be used. The digital processing chain H will typically also include one or more further stages, for example the first digital filter stage $H_{sens}$ providing compensation for the first transfer function $G_{sens}$ of the current sensor 11 response, and/or additional signal conditioning stages.

In some examples, one or more digital filter stages (for example having third or fourth transfer functions $H_{sens}$, $H_{filt}$) may each be implemented as one or more difference equations having coefficients set in dependence on the desired transfer functions $H_{sens}$, $H_{filt}$. Coefficients of the one or more difference equations may be iteratively determined based on comparing an overall transfer function of the difference equation(s) to the desired transfer function (inverse response) $H_{sens}$, $H_{filt}$, and adjusting the coefficients of the difference equation(s) until a close enough match is obtained. In some examples, closed form methods for determining the coefficients of one or more difference equations providing digital filter stages $H_{sens}$, $H_{filt}$ of the processing chain H may be available or may be derived. A worked example of a digital processing chain H for a 50 Hz current I(t) and corresponding signal S(t) and a relatively low order difference equation is described hereinafter (in relation to FIGS. 10 to 15). The coefficients of the difference equation(s) are preferably set, or adjusted, based on calibrations performed after assembly/fabrication of an apparatus 1.

The controller 8 may also be configured to numerically integrate the output of the difference equation (third transfer function $H_{sens}$ following the fourth transfer function $H_{filt}$), or alternatively the difference equation may be configured to integrate the digitised signal $S_{ADC}$ prior to, or at the same time as, compensating for the frequency and phase response of the second transfer function $G_{filt}$ (third transfer function $H_{sens}$ before, or merged with, the third transfer function $H_{filt}$).

Figure 5:
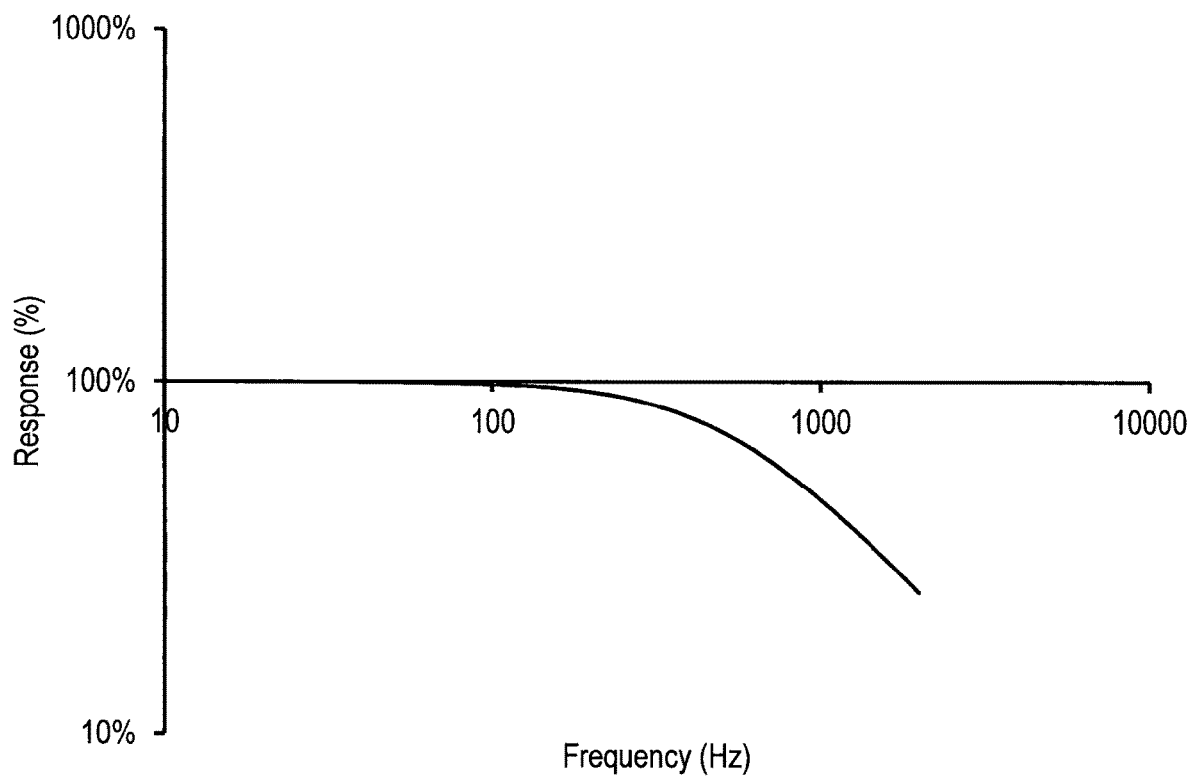
FIG. 5 is a plot of frequency response of a typical RC filter for a 60 Hz power metering application.
Figure 6:
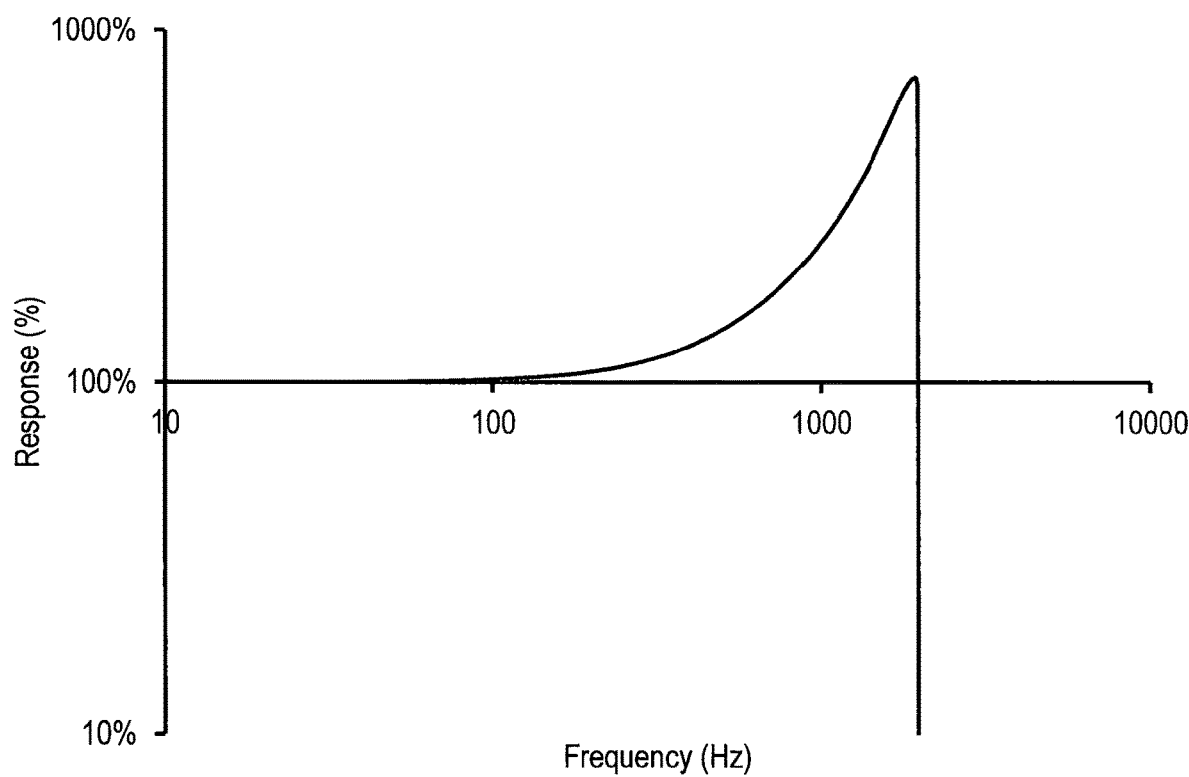
FIG. 6 is a plot of frequency response of an IIR inverse filter to compensate RC response in FIG. 3.
Figure 7:
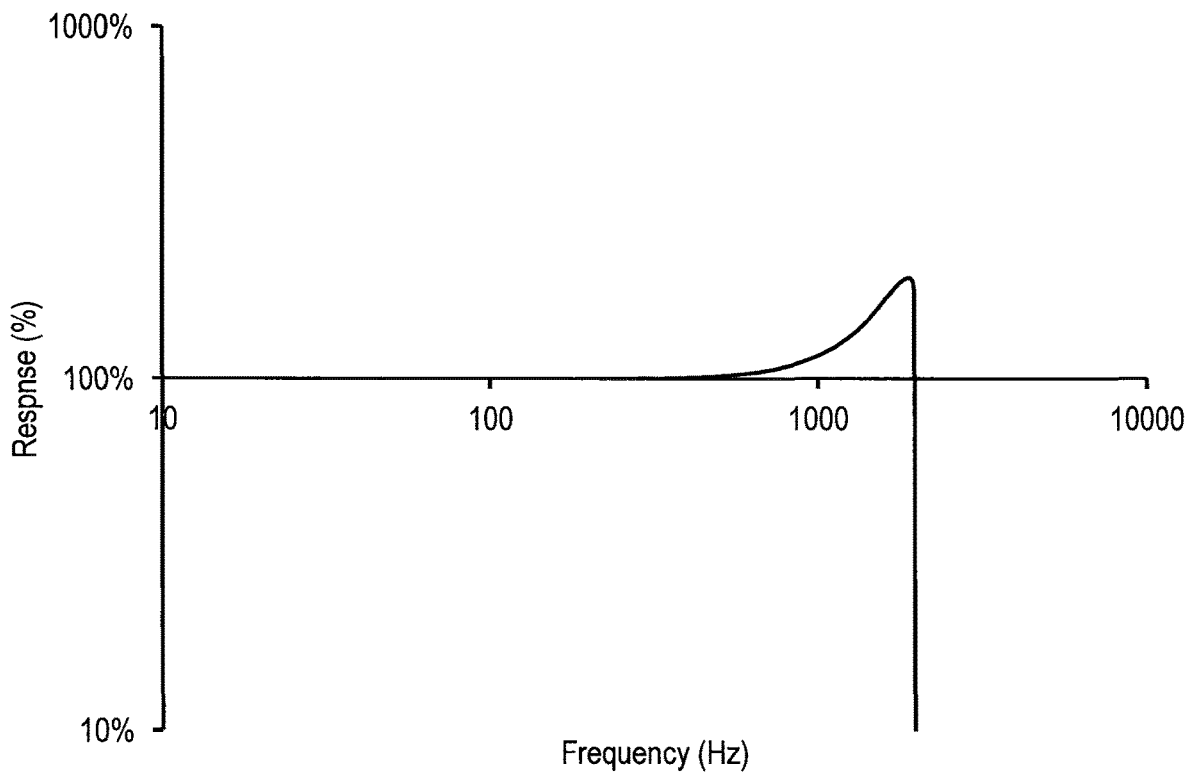
FIG. 7 is a plot of the combined frequency response of an RC filter and IIR inverse filter.

FIG. 5 shows the amplitude response (related to the second transfer function $G_{filt}$) of a typical RC filter such as might be used to provide the low-pass filter 12 for an apparatus intended for a 60 Hz power measurement application. FIG. 6 shows the corresponding amplitude response of a matching inverse IIR filter (related to the fourth transfer function $H_{filt}$), and FIG. 7 shows the resulting combined amplitude response.

In one example which is most favourable when the low-pass filter 12 takes the form of a single-pole low-pass filter, processing the digitised signal $S_{ADC}$ using the digital processing chain H may include numerically integrating the digitised signal $S_{ADC}$ to generate an integrated output signal $\int S_{ADC}$, then adding a fraction of the digitised signal $S_{ADC}$ to the integrated output signal $\int S_{ADC}$. The fraction of the digitised signal $S_{ADC}$ added to the integrated output signal should preferably be calibrated for the specific low-pass filter 12 of a particular apparatus 1, in order to maximise the degree of compensation for the frequency and phase response of the low-pass filter 12. Numerical integration of the digitised signal $S_{ADC}$ may be based on the most recently sampled value of the digitised signal $S_{ADC}$, any number of previously sampled values of the digitised signal $S_{ADC}$ and/or any previously calculated values of the integrated output signal $\int S_{ADC}$. As mentioned hereinbefore, numerical integration may be implemented as one stage of a multi-part digital processing chain H.

Referring again to FIG. 4, an example of implementing the compensation by adding a fraction of the digitised signal $S_{ADC}$ to the integrated output signal $\int S_{ADC}$ is to consider that the error introduced by the RC filter is just the voltage that appears across the resistor R in the RC network. By calculating this voltage, it can be added back onto a digitised signal $S_{ADC}$ in the form of a voltage $V_{adc}$ sampled by the ADC 13 to create the voltage on the other side of the resistor, i.e., the unfiltered voltage. The voltage across the resistor R equals the current multiplied by the resistance R. The current is equal to the current through the capacitor C, which is equal to the capacitance C multiplied by the rate of change of voltage. Because the capacitor is effectively connected across the ADC input, the voltage is just the ADC value.

Hence, for a current sensor 11 with mutual inductance M:

$$M\frac{dI}{dt} = V_{adc} + RC\frac{dV_{adc}}{dt} \tag{1}$$

Consider that a subsequent signal processing step for a mutual inductance sensor is typically to integrate to recover the originally measured current signal:

$$I = \frac{1}{M}\int\left[V_{adc} + RC\frac{dV_{adc}}{dt}\right]dt \tag{2}$$

Integrating the second term, the correction term becomes $RCV_{adc}$, which can simply be added to the output of the integrator to reconstruct the current signal:

$$I = \frac{1}{M}\left[\int V_{adc}dt + RCV_{adc}\right] \tag{3}$$

Hence the RC filter response may simply be corrected by adding in a proportion of the ADC signal to the integrated signal. In practical terms, care is needed to match the group delay between the ADC signal and the integrated signal. For example, when implementing a digital integrator, it may typically have a group delay of e.g. 1 sample (or more depending on the specific implementation). Consequently, when the fraction of the unintegrated signal is added, it should be delayed by the same group delay (see also the worked example described in relation to FIGS. 10 to 15).

This arrangement becomes particularly advantageous as the system bandwidth extends to higher harmonics. At frequencies near the fundamental $f_0$, the majority of the reconstructed current signal is produced directly by the digital integrator, as the relative contribution of the raw ADC signal is small, yielding all the advantages noted above for carrying out the signal processing in the digital domain. Any variations of time and temperature in the RC filter constant have a minimal effect on the measurement performance at the fundamental, much less than would be seen in an analogue integrator with the same component stability. At frequencies above the RC filter −3 dB point, where typically the requirements on absolute accuracy are less demanding, the majority of the reconstructed current signal comes from the raw ADC signal, as the relative contribution of the digitally integrated part becomes smaller. The RC filter is simply providing most of the integration function at the higher frequencies in this case, whilst at the same time limiting the dynamic range that would otherwise be required of the ADC.

Phase Response

As noted hereinbefore, it can be difficult to construct stable analogue filters with low corner frequencies, particularly passive filters that ideally should be placed between a mutual inductance sensor 11 and an ADC 13 input, where high series impedances typically cannot be tolerated. Low-cost, large-value (e.g., 100 nF) NPo ceramic capacitors recently became available. These capacitors have nominally zero temperature coefficient and excellent long-term stability relative to film capacitors (which used to be the only choice for stable capacitors at 100 nF and above). Combined with low temperature coefficient resistors, this enables a sufficiently stable low frequency low-impedance RC filter to be incorporated into a commercial electric meter between a mutual inductance sensor and an ADC input at a reasonable cost.

However, although these capacitors are extremely stable, they are not made to tight tolerance (5% or 10% tolerances are typically), so the RC time constant (and hence filter bandwidth and line frequency phase shift) will vary from part to part. Hence, it is not possible simply to fix the filter coefficients in the digital reconstruction filter described above, or to fix the fraction of the ADC value added back, because these fixed characteristics will not exactly cancel out the variation of effects of the RC filter with tolerance, leading to large phase and amplitude errors.

Calibration of Phase Response

Considering a power measurement system comprising one or more mutual inductance current sensors (for example current sensors 11 of apparatus 1) and one or more voltage sensors, such as might form the basis of a power or electricity meter, it is generally necessary to find a way to match the current and voltage phase responses at line frequency, and to set the current and voltage (or at least power) gain so that the system measures power accurately over the requisite range of power factors. Commonly this is achieved by a calibration process. Whilst there are many variants, this is usually implemented either by applying precisely known currents and voltages with a precise phase angle relationship such that the expected power is known and can be compared against the measured power, or by comparing the response of the device under test against a precise reference power meter whilst applying approximately known, but not precise, currents and voltages. Depending on the information calculated or reported by the devices, this may require more than one set of conditions to determine all the required coefficients. Verification measurements may also need to be done with different currents and phase angles depending on jurisdiction.

Using a low-pass filter in the form of a low-frequency RC filter between a mutual inductance current sensor (e.g. current sensor 11) and the ADC (e.g. ADC 13), nearly all the phase variation between current and voltage channels to be eliminated through calibration will result from variations in the RC time constant as a result of the tolerance of the capacitance C. The calibration process may make best use of this fact, and phase variations measured at the line frequency may be trimmed out by adjusting the nominal RC value in the compensation described above, instead of following the traditional methods of varying the delay between the current and voltage inputs.

Having determined the phase error by a suitable measurement, then in the case where an IIR filter is used to reconstruct the current signal, a calculation is carried out to update the IIR coefficients to modify the digital processing chain H response (in particular the fourth transfer function $H_{filt}$ of the second digital filter stage) to change the phase response to correct the phase error, and these updated IIR filter coefficient are then substituted for the original values. In the case where the reconstruction is achieved by adding the $V_{adc}$ to the integrator output, the phase adjustment is achieved simply by varying the coefficient (fraction) used to multiply $V_{adc}$, i.e., by varying RC in the $RCV_{adc}$ correction term.

Other system phase errors may still exist, for example, from higher frequency anti-alias bandwidth limits in the current and voltage channels, or from sampling skew between current and voltage channels. These can be correctly compensated for at line frequency, but lack of matching will lead to phase errors in the harmonic and sub harmonic response of the meter, so good design practice should still be taken to minimise these effects and to match the channels.

Figure 8:
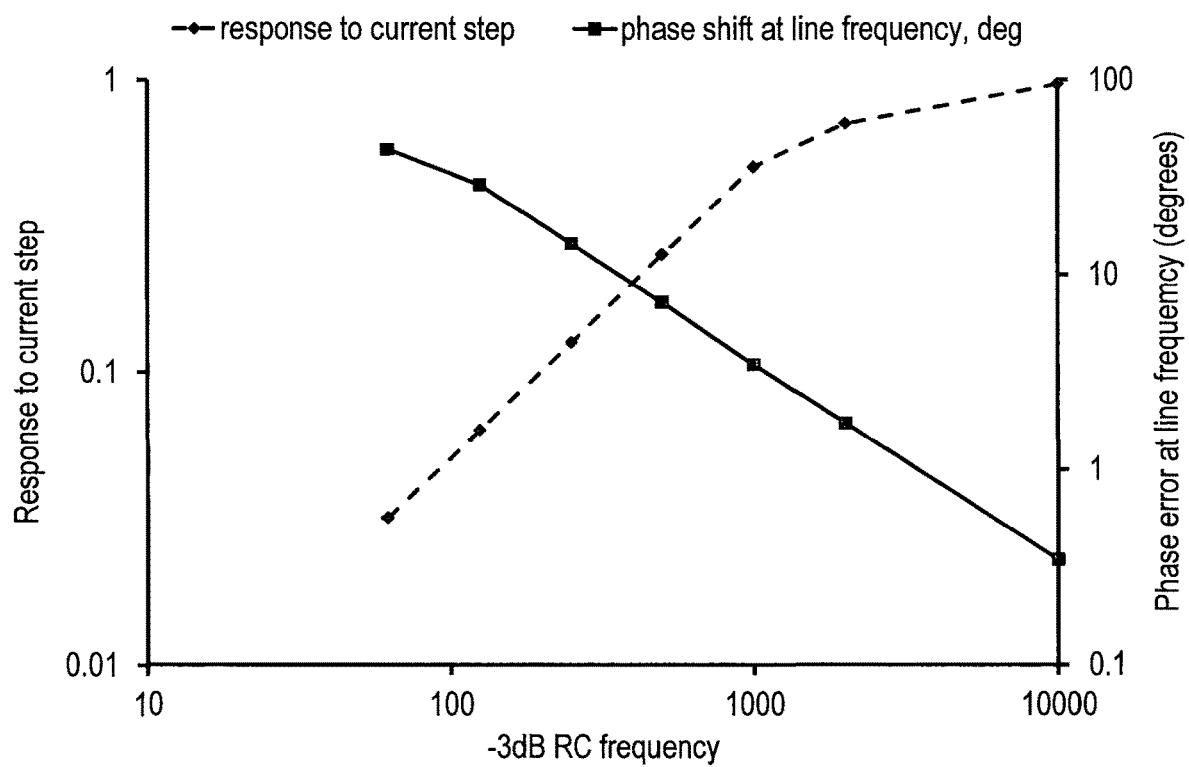
FIG. 8 illustrates step response and fundamental phase error as a function of RC filter −3 dB frequency.

Referring to FIG. 8, examples of the size of these effects are shown.

Figure 9:
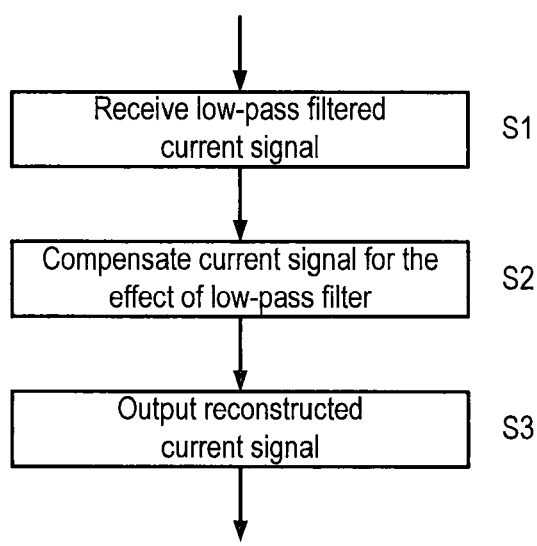
FIG. 9 is a process flow diagram of a method of compensating for the effect of low-pass filtering a signal from a mutual inductance current sensor.

Referring to FIG. 9, the processor 16 of the controller 8 (FIG. 1) corrects for the effect of the low-pass filter 12 (FIG. 1).

The controller 8 receives the low-pass filtered dI/dt signal S(t) (step S1), reconstructs the current I(t) compensating for the effect of the current sensor 11 and low-pass filter 12 as herein described (step S2) and outputs a reconstructed current signal (step S3).

The correction process may be implemented in software, using correction code 19 (FIG. 1) to apply the digital processing chain (having overall digital domain transfer function H).

Characteristics of Systems Covered

Embodiments of the invention can be used in situations where the frequency response of a mutual inductance sensor is attenuated in the analogue domain at a frequency significantly below the highest harmonic required to be measured by the application, significantly below the Nyquist frequency of the subsequent sampling system, but generally above the fundamental, such that the only way that the application is able to measure the highest harmonic sufficiently accurately is by compensating to some extent for the attenuation and phase shift caused by the frequency attenuation. For example, in a 50 Hz or 60 Hz power measurement system, this might be by using an RC filter with a −3 dB frequency of 500 Hz or 600 Hz respectively, ten times the fundamental frequency, or lower.

To determine whether a particular apparatus is applying the teachings of the present specification, the frequency response (or second transfer function $G_{filt}$) of the analogue signal components (e.g. low-pass filter 12) connecting between a mutual inductance current sensor and an analogue-to-digital converter of such apparatus may be measured. For example using a frequency sweep and monitoring using an oscilloscope.

Alternatively, the frequency response (or second transfer function $G_{filt}$) of the analogue signal components (e.g. low-pass filter 12) connecting between a mutual inductance current sensor and an analogue-to-digital converter of such apparatus may be simulated based on a schematic and/or inspection of the circuit.

The measured frequency response (or second transfer function $G_{filt}$) may be compared to the measurement requirements of said apparatus. If, for example, the apparatus is required to measure up to the $K^{th}$ harmonic and/or outputs data corresponding to harmonics up to the $K^{th}$ harmonic, yet the measured frequency response (or second transfer function $G_{filt}$) of the low-pass filter has a −3 dB point at a frequency below the $K^{th}$ harmonic, then digital compensation using a fourth transfer function $H_{filt}$ (i.e. an approximate inverse to the low-pass filter frequency response) must logically be applied by said apparatus in the digital domain. For example, if an apparatus is required to and/or outputs data up to the $50^{th}$ harmonic, yet has a low-pass filter with a measured analogue frequency response (or second transfer function $H_{filt}$) with −3 dB point around the $10^{th}$ harmonic, then it can be concluded that some digital domain compensation is being employed (or else any measurements provided by such an apparatus would be inaccurate).

Analogue Response Compensation

The methods and approach hereinbefore described are not limited to RC filters, nor to single pole filters, nor to low-pass filters. In any signal processing application where digital filtering can be applied, the digital filters can be used to correct for non-ideality in any analogue signal processing. For example, if a signal chain contains a second-order cascaded RC filter, for example a higher frequency anti-alias filter, then a similar technique can be used to compensate for the frequency and phase response of this filter too, for example by calculating the inverse response function of this second filter and implementing as an IIR filter (e.g. a further stage of the digital processing chain H). More generally, it is possible to calculate the inverse response of all the input filter components in a more complex analogue input network, and to implement this as an IIR filter so that the frequency and phase response more closely matches the response required by the application.

Compensation in Frequency Domain

Many sophisticated power measurement devices measure the harmonic content by carrying out a Fast Fourier Transform (FFT) on the current and voltage waveforms. The frequency and phase response of the input filter network is known from pre-calibration experiments using known signals (e.g. the second transfer function $G_{filt}$), allowing a transfer function inverse to that low-pass filter to be derived (e.g. the fourth transfer function $H_{filt}$). The inverse transfer function is applied in the frequency domain, i.e., on the output of the FFT, and similarly to carry out the power calculations in the frequency rather than the time domain (multiplying each frequency component by its complex conjugate). Digital integration (which typically compensates for the current sensor 11 response $G_{sens}$) is just another filter, and it too may be applied in the frequency domain.

Alternatively, after applying the fourth transfer function $H_{filt}$ (substantially) inverse to the second transfer function $G_{filt}$ of the low-pass filter, the signal may be transformed back into the time domain using an inverse Fast Fourier Transform (iFFT), prior to integration and determination of the power (or other properties of the current I(t)).

The controller 8 may be configured to calculate one or more parameters of the original current signal I(t), for example RMS current, the amplitudes and phases of the current harmonics, and when combined with a voltage waveform in a power or electricity meter or a power analyser, the active, reactive and apparent powers, either total, fundamental-only or per-harmonic, and so forth, based on the filtered frequency domain signal.

Although FFT methods are usually preferred, any other methods for obtaining the discrete Fourier transform may be used instead. Alternatively, signals may be transformed between time and frequency domains using Laplace transform methods.

Applications Outside Power and Energy Measurement

The application of this combination of reduced analogue bandwidth and digital reconstruction with a mutual inductance sensor is not limited to the power measurement applications hereinbefore described. Any applications where a wide bandwidth A.C. current measurement with a mutual inductance sensor is needed can make use of this technique, with the dynamic range advantage increasing proportionately to the ratio between the highest and lowest frequencies of interest. Particular examples outside the fields of electrical metering or monitoring of A.C. power systems (e.g. measurements of RMS current) may include, but are not limited to, are fault detection, measurements of conducted emissions for electromagnetic compatibility (EMC) compliance, combination wave surge current measurement, and so forth.

Worked Example

An example of signal processing appropriate to a 50 Hz power system will now be described. This worked example is not intended to limit the teachings of this specification described hereinbefore. Features and/or principles of the description hereinbefore should be assumed to be applicable to modifying the worked example, unless explicitly indicated otherwise or where such features and/or principles would be self-evidently incompatible.

Figure 10:
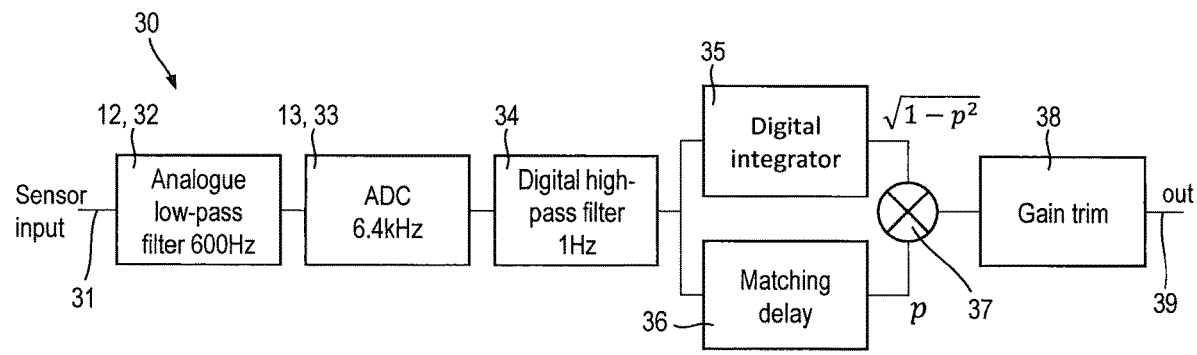
FIG. 10 is a block diagram of a signal processing chain.

Referring also to FIG. 10, a block diagram of an exemplary signal processing chain 30 is shown, including a digital processing chain 34, 35, 36, 37, 38.

The input 31 from a dI/dt sensor (e.g. current sensor 11) is passed through a low-pass filter 12 in the form of a first-order low-pass analogue filter 32, with a −3 dB frequency of 600 Hz. This signal is then fed into an Analogue to Digital Converter (ADC) 13, creating a digital representation of the input signal at a word rate of 6.4 kHz. (Preferably the ADC is a sigma-delta type, with a modulator frequency in excess of 1 MHz, to avoid the need for further anti-aliasing filters). The first transfer function $G_{sens}$ in this example corresponds to the amplitude and phase effects of the dI/dt sensor, and the second transfer function $G_{filt}$ corresponds to the amplitude and phase effects of the first-order low-pass analogue filter 32.

In the controller 8, the signal is passed through a digital processing chain including a digital high pass filter 34, a digital integrator block 35, a matching delay block 36, an adder 37 and a gain trimmer block 38. These elements 34, 35, 36, 37, 38 collectively correspond to the digital domain transfer function H for this example. The signal is first passed through the high-pass filter 34, which is of conventional design, with a −3 dB frequency of 1 Hz, substantially below the power system frequency of 50 Hz. The purpose of the high-pass filter 34 is to remove any D.C. components of the signal before integration, as D.C. components would integrate to give a continuously rising or falling signal.

The next stage is the digital integrator block 35. One simple form can be described by the difference equation:

$$y_i[n] = (1-k) \times y[n-1] + \Delta t \left[ \frac{x[n] + x[n-1]}{2} \right] \quad (4)$$

where $y_i[n]$ denotes the output samples, $x[n]$ denotes the input samples, $k \ll 1$ in order to ensure that the integrator is stable, and $\Delta t$ is the time between successive samples of the ADC 13. This integrator has a group delay of ~half a sample period, so an unintegrated signal path with matching group delay can be created by the matching delay block 36 using the difference equation:

$$y_u[n] = w \times \frac{x[n] + x[n-1]}{2} \quad (5)$$

where w is a weighting factor chosen such that at the calibration frequency (50 Hz in this example), the amplitudes of the integrated and unintegrated signal paths are the same. The weighting means that the integrated and unintegrated waveforms at 50 Hz are equal amplitude signals with 900 phase difference, which makes it easy to alter the phase without affecting the amplitude during calibration.

The final corrected output 39 is created by the adder 37 and gain trim block 38 using a combination of the integrated and unintegrated samples:

$$y[n] = \text{gain} \times (\sqrt{1-p^2} \times y_i[n] + p \times y_u[n]) \quad (6)$$

The calibration process is used to set the values of p (to achieve the phase trim) and gain as follows:

Initially set p=0 and gain=1. Measure a sinusoidal current waveform at the calibration frequency of, for example, 50 Hz. The expected output is a sinusoidal current waveform exactly in phase with and the same amplitude as the input.

First determine the phase error, theta. Calculate:

$$t = \tan \theta \quad (7)$$

Then calculate the updated value of the phase trim p as:

$$p = \sqrt{\frac{t^2}{1+t^2}} \quad (8)$$

If necessary, re-measure the output and iteratively fine tune the value of p until the phase error theta is zero.

Second, measure the output amplitude, and adjust the value of gain such the output amplitude matches the input signal level.

The principle of operation is illustrated with reference also to FIG. 11 to 15.

Figure 11:
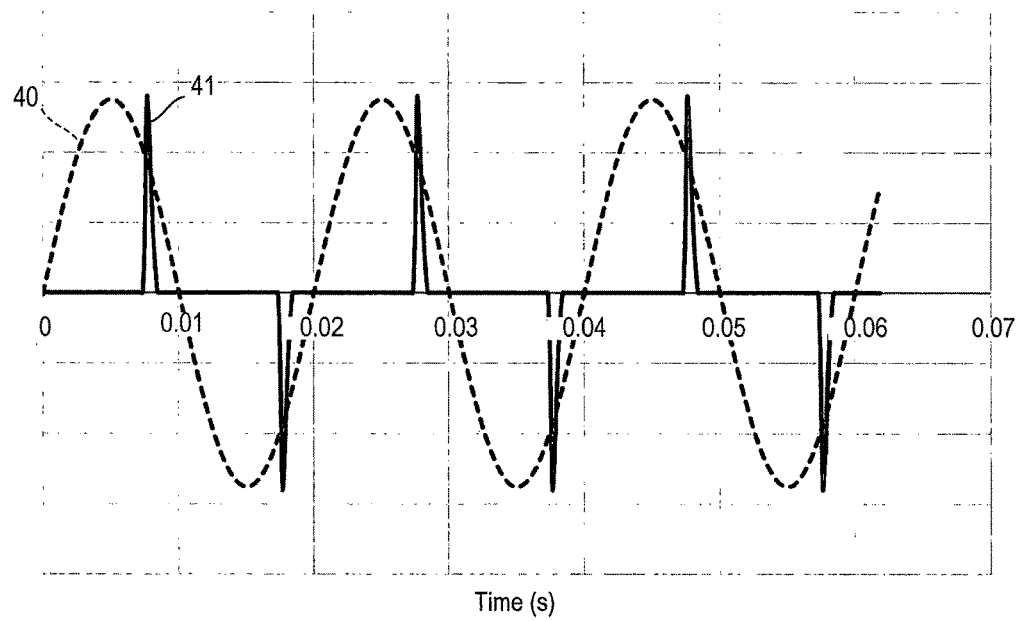
FIG. 11 illustrates examples of different types of currents in an A.C. power system.

In FIG. 11, two different current waveforms of approximately equal amplitude are shown. The dotted trace 40 shows a sinusoidal 50 Hz current waveform such as might be seen with a resistive load, or such as might be used to calibrate the gain and phase. The solid trace 41 shows a phase-fired triac waveform at approximately 135° such as might be seen when using a triac dimmer circuit on a load such as a switch-mode power supply for an LED light. This second waveform 41 represents a relatively extreme waveform in terms of the ratio of the fundamental to the harmonics. The sinusoidal 50 Hz current waveform 40 and the phase-fired triac waveform 41 are examples of currents I(t) which an apparatus 1 may be used to measure/monitor/meter etc.

Figure 12:
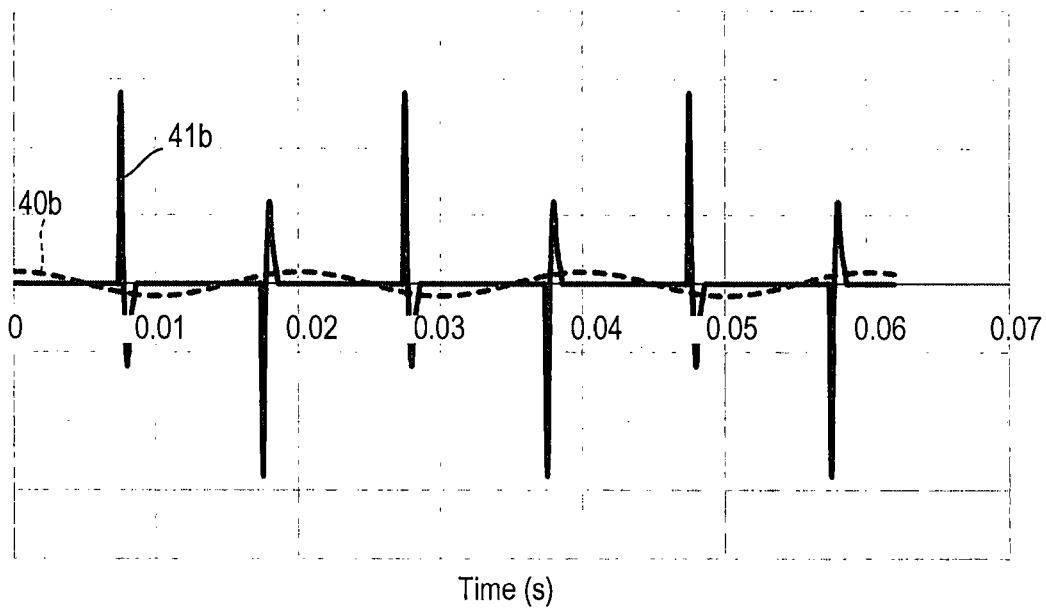
FIG. 12 illustrates signals obtained by measuring the currents shown in FIG. 11 using a mutual inductance current sensor.

FIG. 12 shows the outputs 40b, 41b of a dI/dt sensor measuring these two waveforms. Although the original currents had substantially the same amplitude, the amplitude of the dI/dt signal 41b for the phase-fired waveform 41b is substantially higher (about 16 times in this example) than that of the sinusoidal waveform 40b. Note also the 90 degree phase shift of the sinusoidal waveform 40b (these effects on amplitude and phase correspond to the contributions of the current sensor 11 to the first transfer function $G_{sens}$). The sinusoidal waveform 40b and the phase-fired waveform 41b are examples of signals S(t).

Figure 13:
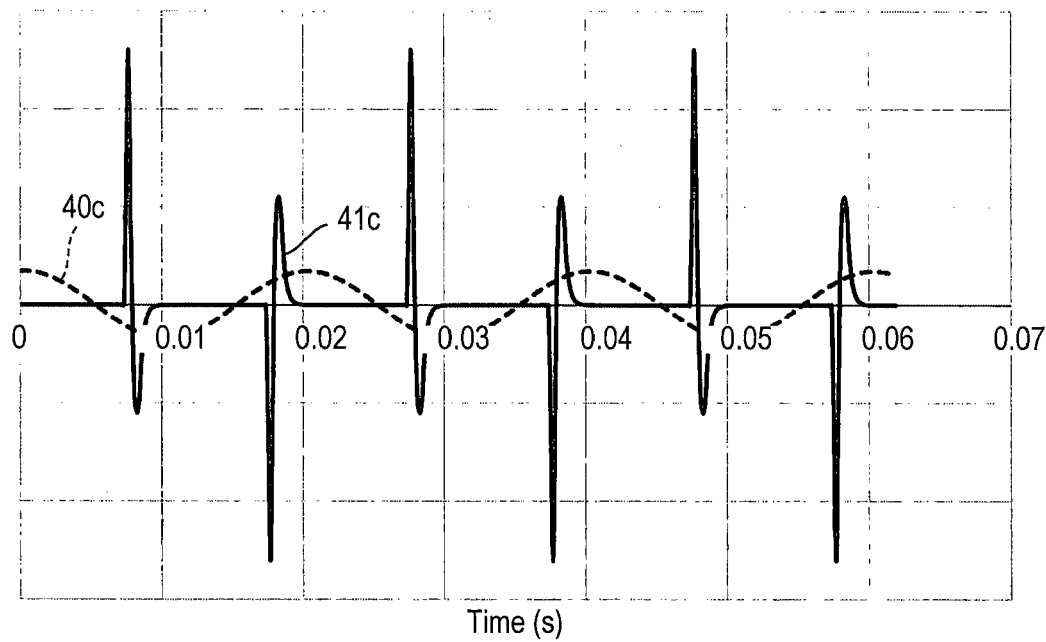
FIG. 13 illustrates the signals shown in FIG. 12 after low-pass filtering.

FIG. 13 shows the signals 40c, 41c from FIG. 12 after a 600 Hz low-pass first order analogue filter 12, 32 has been applied. The dI/dt signal 41c is now 7 times larger amplitude than the sinusoidal signal 40c, rather than 16 times. This is the signal which is digitised by the subsequent analogue to digital converter (ADC) 13, 33. Clearly, if a lower corner frequency such as 300 Hz were to be chosen, a larger degree of attenuation could be achieved. The benefit of the attenuation is to reduce the dynamic range requirements for the ADC 13, 33 and to minimise the chance of clipping. The sinusoidal waveform 40c and the phase-fired waveform 41c are examples of filtered signals $S_{filt}(t)$ which would be sampled to obtain digitised signals $S_{ADC}$. The sinusoidal waveform 40c and the phase-fired waveform 41c include the effects of the first and second transfer functions $G_{sens}$, $G_{filt}$ with respect to the original current I(t) signals 40, 41).

Figure 14:
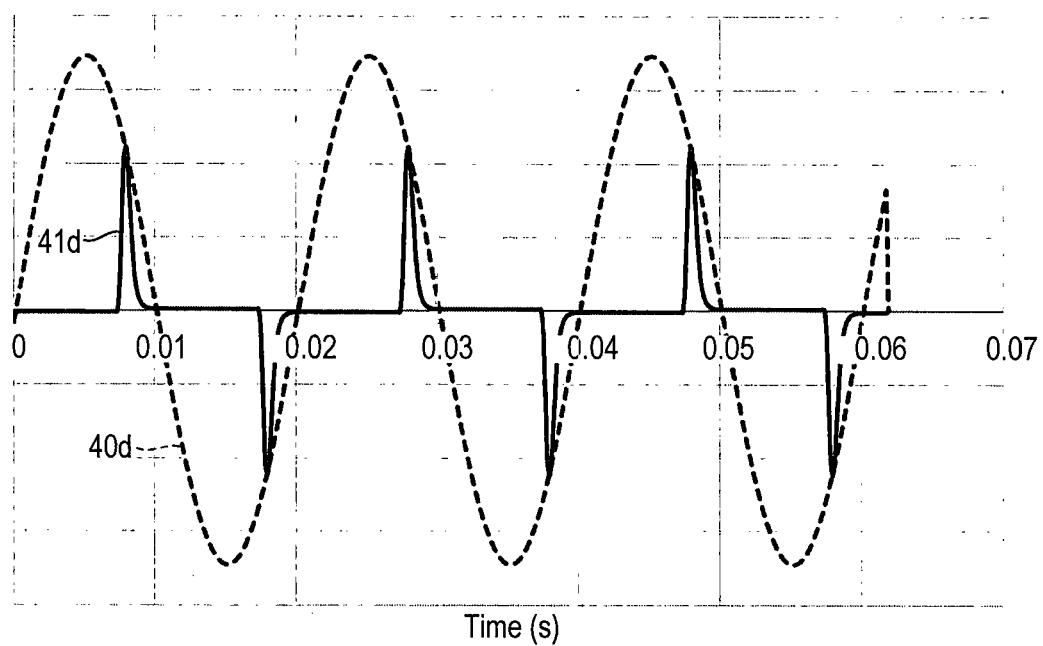
FIG. 14 illustrates integrating the low-pass filtered signals shown in FIG. 13 without compensating for the low-pass filtering.

FIG. 14 shows the result of conventional digital signal processing of the low-pass filtered and digitised signals 40d, 41d shown in FIG. 13. It is clear that the amplitude of the phase-fired current waveform 41d has been significantly attenuated—it is now 63% of the amplitude of the sinusoidal signal 40d. This is because the phase-fired current waveform 41d contains significant harmonics above 600 Hz which have been attenuated by the analogue low-pass filter 12, 32.

Figure 15:
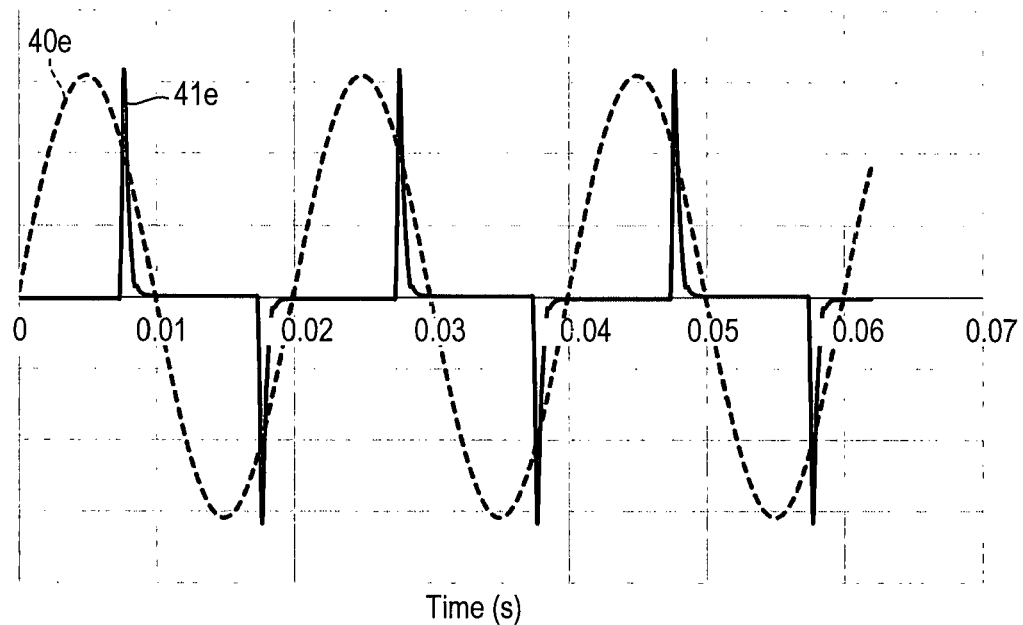
FIG. 15 illustrates integrating the low-pass filtered signals shown in FIG. 13 including compensating for the low-pass filtering.

FIG. 15 shows the results 40e, 41e of the new digital signal processing of the low-pass filtered and digitised signals shown in FIG. 13. The reconstructed phase-fired waveform 41e is restored to the same amplitude as the sinusoidal waveform 40e as a result of the signal processing to compensate for the analogue low-pass filter 12, 32.

Modifications

It will be appreciated that various modifications may be made to the embodiments hereinbefore described. Such modifications may involve equivalent and other features which are already known in the design, manufacture and use of A.C. current measurement using a mutual inductance sensor and component parts thereof and which may be used instead of or in addition to features already described herein.

Features of one embodiment may be replaced or supplemented by features of another embodiment.

Although claims have been formulated in this application to particular combinations of features, it should be understood that the scope of the disclosure of the present invention also includes any novel features or any novel combination of features disclosed herein either explicitly or implicitly or any generalization thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

The invention claimed is:

1. Apparatus comprising:
   a mutual inductance current sensor having a first transfer function;
   a low-pass filter which receives a signal from the current sensor, the low-pass filter having a second transfer function configured to attenuate one or more harmonic components of the signal;
   an analogue-to-digital converter which receives and digitises a filtered signal output from the low-pass filter;
   a controller configured to process a digitised signal from the analogue-to-digital converter using a digital processing chain configured to compensate for the frequency and phase responses of the first transfer function and the second transfer function;
   wherein the apparatus is for measuring a signal corresponding to an alternating current having a fundamental frequency and wherein the apparatus is configured to measure up to a predetermined harmonic of the fundamental frequency;
   wherein the second transfer function of the low-pass filter has a −3 dB corner frequency which lies between the fundamental frequency and the predetermined harmonic.

2. Apparatus according to claim 1, wherein the digital processing chain comprises a first digital filter stage having a third transfer function configured to compensate for the frequency and phase response of the first transfer function.

3. Apparatus according to claim 1, wherein the digital processing chain comprises a second digital filter stage having a fourth transfer function configured to compensate for the frequency and phase response of the second transfer function.

4. Apparatus according to claim 1, wherein the low-pass filter comprises at least one series resistance and at least one parallel capacitance.

5. Apparatus according to claim 1, wherein the digital processing chain is calibrated following fabrication of the apparatus in order to compensate for the second transfer function of the specific low-pass filter.

6. Apparatus according to claim 1, wherein processing the digitised signal using the digital processing chain comprises processing the digitised signal using one or more difference equations, wherein the coefficients of at least one of the difference equations are configured to compensate for the frequency and phase response of the second transfer function.

7. Apparatus according to claim 1, wherein the digital processing chain comprises a second digital filter stage having a fourth transfer function configured to compensate for the frequency and phase response of the second transfer function; and
   wherein processing the digitised signal using the digital processing chain comprises:
   transforming the digitised signal from the time domain to the frequency domain; and
   applying the fourth transfer function in the frequency domain.

8. Apparatus according to claim 1, wherein processing the digitised signal using the digital processing chain comprises:
   numerically integrating the digitised signal to generate an integrated output signal;
   adding a fraction of the digitised signal to the integrated output signal.

9. Apparatus according to claim 1, wherein the low-pass filter is a second order filter or higher.

10. An electricity meter comprising one or more apparatuses according to claim 1, wherein each mutual inductance current sensor is inductively coupled to a corresponding conductor which supplies power from one or more supplies to one or more loads.

11. An electricity meter according to claim 10, wherein the electricity meter meets with non-sinusoidal accuracy requirements of the American National Standards Institute, ANSI.

12. An electricity meter according to claim 10, wherein a dynamic range of current measurements obtained using the electricity meter is improved compared to a second electricity meter which is identical to the electricity meter except that the second electricity meter does not include the low-pass filter.

13. Apparatus for processing signals received from a mutual inductance current sensor having a first transfer function, the apparatus comprising:
   a low-pass filter which receives a signal from the current sensor, the low-pass filter having a second transfer function configured to attenuate one or more harmonic components of the signal;
   an analogue-to-digital converter which receives and digitises a filtered signal output from the low-pass filter;
   a controller configured to process a digitised current signal from the analogue-to-digital converter using a digital processing chain configured to compensate for the frequency and phase responses of the first transfer function and the second transfer function;
   wherein the apparatus is for measuring a signal corresponding to an alternating current having a fundamental frequency and wherein the apparatus is configured to measure up to a predetermined harmonic of the fundamental frequency;
   wherein the second transfer function of the low-pass filter has a −3 dB corner frequency which lies between the fundamental frequency and the predetermined harmonic.

14. Apparatus according to claim 13, wherein processing the digitised current signal using the digital processing chain comprises processing the digitised signal using one or more difference equations, wherein the coefficients of at least one of the difference equations are configured to compensate for the frequency and phase response of the second transfer function.

15. Apparatus according to claim 13, wherein the digital processing chain comprises a second digital filter stage having a fourth transfer function configured to compensate for the frequency and phase response of the second transfer function; and
   wherein processing the digitised signal using the digital processing chain comprises:
   transforming the digitised signal from the time domain to the frequency domain; and
   applying the fourth transfer function in the frequency domain.

16. Apparatus according to claim 13, wherein processing the digitised current signal using the digital processing chain comprises:
   numerically integrating the digitised signal to generate an integrated output signal;
   adding a fraction of the digitised signal to the integrated output signal.

17. A method comprising:
   receiving a signal from a mutual inductance current sensor having a first transfer function;

filtering the received signal in the analogue domain using a low-pass filter having a second transfer function configured to attenuate one or more harmonic components from the signal;

converting the filtered current signal to the digital domain to generate a digitised signal;

processing the digitised current signal using a digital processing chain configured to compensate for the frequency and phase responses of the first transfer function and the second transfer function;

wherein the signal corresponds to an alternating current having a fundamental frequency and wherein the method is intended to measure up to a predetermined harmonic of the fundamental frequency;

wherein the second transfer function of the low-pass filter has a −3 dB corner frequency which lies between the fundamental frequency and the predetermined harmonic.

18. A method according to claim 17, wherein processing the digitised signal using the digital processing chain comprises processing the digitised signal using one or more difference equations, wherein the coefficients of at least one of the difference equations are configured to compensate for the frequency and phase response of the second transfer function.

19. A method according to claim 17, wherein the digital processing chain comprises a second digital filter stage having a fourth transfer function configured to compensate for the frequency and phase response of the second transfer function; and wherein processing the digitised signal using the digital processing chain comprises:

transforming the digitised signal from the time domain to the frequency domain;

applying the fourth transfer function in the frequency domain.

20. A method according to claim 17, wherein processing the digitised signal using the digital processing chain comprises:

numerically integrating the digitised signal to generate an integrated output signal;

adding a fraction of the digitised signal to the integrated output signal.

* * * * *